(12) United States Patent
Williams, Jr. et al.

(10) Patent No.: US 8,818,745 B2
(45) Date of Patent: Aug. 26, 2014

(54) MONITORING AND ANALYSIS OF POWER SYSTEM COMPONENTS

(75) Inventors: Olin Alvin Williams, Jr., Lawrenceville, GA (US); Michael Jack Swan, Woodstock, GA (US)

(73) Assignee: Southern Company Services, Inc., Atlanta, GA (US)

( * ) Notice: Subject to any disclaimer, the term of this patent is extended or adjusted under 35 U.S.C. 154(b) by 0 days.

(21) Appl. No.: 13/484,768

(22) Filed: May 31, 2012

(65) Prior Publication Data

US 2013/0325383 A1     Dec. 5, 2013

(51) Int. Cl.
*G01R 23/16* (2006.01)

(52) U.S. Cl.
USPC .......................................... 702/76; 702/185

(58) Field of Classification Search
USPC ......... 702/65, 58, 35, 36, 38, 39, 64, 76, 188, 702/189, 182, 184, 185
See application file for complete search history.

(56) References Cited

U.S. PATENT DOCUMENTS

| | | | | |
|---|---|---|---|---|
| 4,246,581 | A * | 1/1981 | DiToro | 342/369 |
| 4,903,006 | A * | 2/1990 | Boomgaard | 307/3 |
| 5,371,760 | A * | 12/1994 | Allen et al. | 375/142 |
| 5,583,891 | A * | 12/1996 | Espe et al. | 375/346 |
| 6,331,996 | B1 * | 12/2001 | Lin et al. | 375/130 |
| 6,348,891 | B1 * | 2/2002 | Uemura | 342/413 |
| 6,549,017 | B2 | 4/2003 | Coffeen | |
| 6,549,862 | B1 | 4/2003 | Huang et al. | |
| 6,917,888 | B2 * | 7/2005 | Logvinov et al. | 702/59 |
| 6,985,521 | B1 * | 1/2006 | Rezvani et al. | 375/222 |
| 7,460,534 | B1 | 12/2008 | Bellenger | |
| 7,484,897 | B2 * | 2/2009 | Ono et al. | 385/53 |
| 7,848,897 | B2 * | 12/2010 | Williams, Jr. | 702/60 |
| 2009/0134880 | A1 | 5/2009 | Grund | |
| 2009/0135977 | A1 * | 5/2009 | Sheu | 375/371 |
| 2009/0243876 | A1 * | 10/2009 | Lilien et al. | 340/870.01 |
| 2010/0087959 | A1 | 4/2010 | Williams, Jr. | |
| 2010/0244814 | A1 * | 9/2010 | Franklin | 324/117 R |
| 2011/0187578 | A1 * | 8/2011 | Farneth et al. | 342/27 |

OTHER PUBLICATIONS

J.-J. Lee, S.-J. Choi, H.-M. Oh, W.-T. Lee, K.-H. Kim and D.-Y. Lee "Measurements of the communications environment in medium voltage power distribution lines for wide-band power line communications", 2004, Proc. Int. Symp. Power Line Commun. Appl.*

(Continued)

*Primary Examiner* — John Breene
*Assistant Examiner* — Yaritza H Perez Bermudez
(74) *Attorney, Agent, or Firm* — Thomas Horstemeyer LLP

(57) ABSTRACT

Various methods and systems are provided for monitoring and analysis of electrical components. In one embodiment, a method includes obtaining raw radio frequency (RF) component data associated with an electrical component, cross-correlating the raw RF component data with a synchronized pseudo-random sequence (PRS) signal injected into the electrical component to determine a correlated impulse response, and determining a condition of the electrical component based at least in part upon the correlated impulse response. In another embodiment, a system includes a signal injection system coupled to an electrical component. The signal injection system injects a synchronized PRS signal into the electrical component. A data capture device obtains raw RF component data synchronized with the PRS signal through a RF antenna. A data analysis device cross-correlates the raw RF component data with the PRS signal to determine characteristics associated with the electrical component.

20 Claims, 23 Drawing Sheets

(56) References Cited

OTHER PUBLICATIONS

Dough Lowe, Electronics All-In-One Desk Reference for Dummies, Feb. 2012, http://www.dummies.com/how-to/content/radio-electronics-transmitters-and-receivers.html.*

Chambers Dictionary of Science and Technology, 1999, Chambers, 49,954,956,1190.* http://www.thefreedictionary.com/radio+frequency, The Free Dictionary by Farlex.*

Coffeen et al., A New Technique to Detect Winding Displacements in Power Transformers Using Frequency Response Analysis, (May 2003).

L. T. Coffeen, J. A. Britton, J. Rickmann, E. Gockenbach, A New Objective Technique to Detect Winding Displacements in Power Transformers Using Frequency Response Analysis, Without the Need for Historical Data, ,(Aug. 2003).

Singh et al., A Novel method for detection of transformer winding faults using Sweep Frequency Response Analysis, 2007, pp. 1-9. (Jun. 2007).

Horan et al., A Novel Pulse Echo Correlation Tool for Transmission Path Testing and Fault Finding using Pseudorandom Binary Sequences, 2005, pp. 1-9. (Oct. 2005).

Dong et al., Study on the Voltage Traveling Wave wavefront Detection for CVT, 2005, pp. 1-5. (Dec. 2005).

\* cited by examiner

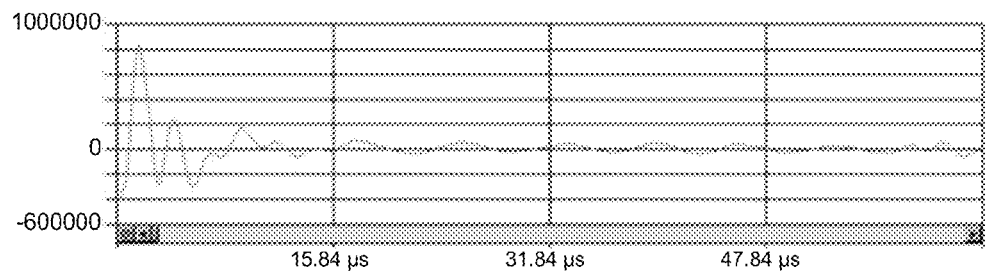
Impulse response from one captured sample
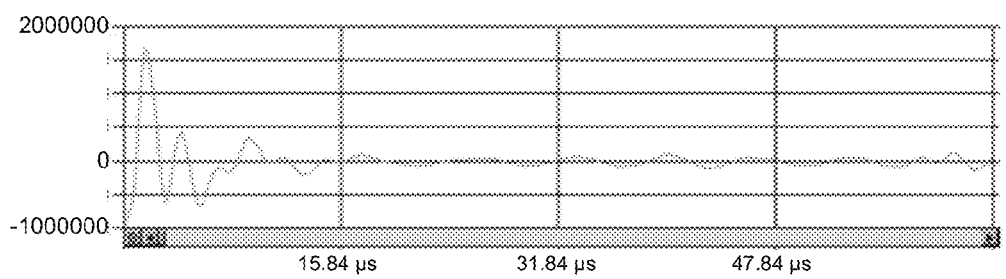
Impulse response from two averaged samples
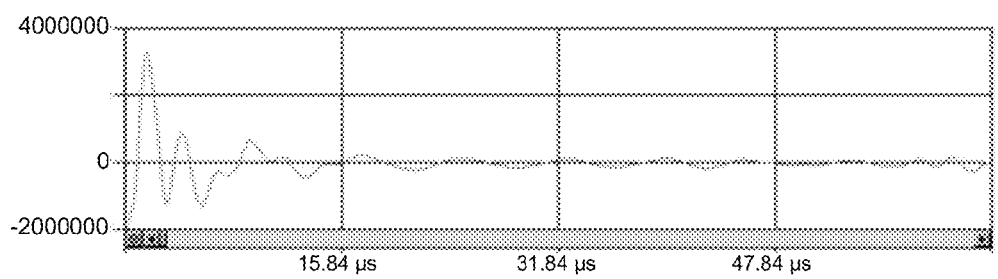
Impulse response from four averaged samples
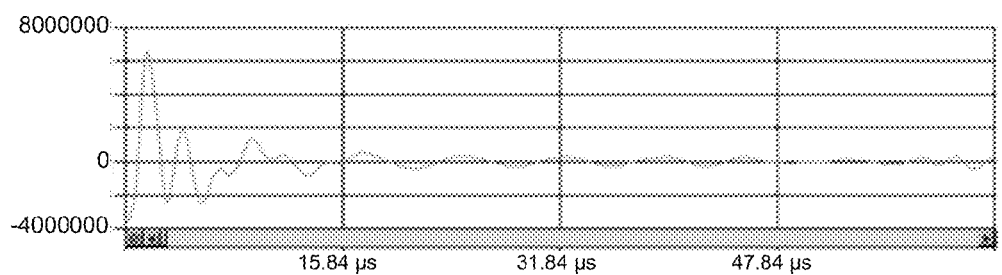
Impulse response from eight averaged samples
FIG. 15A

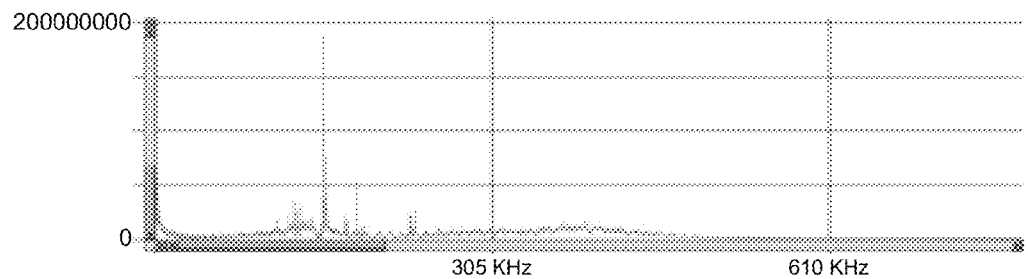
Frequency response from one captured sample
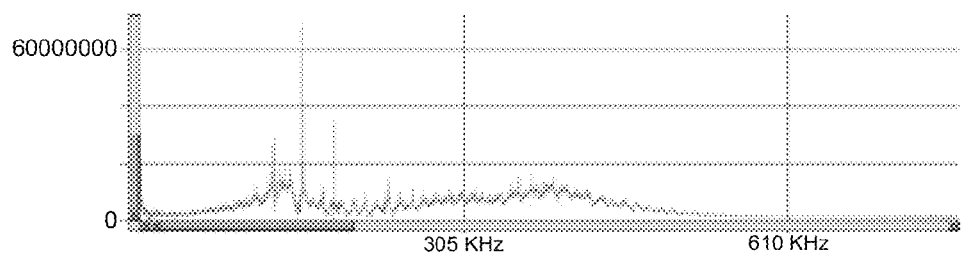
Frequency response from four averaged samples
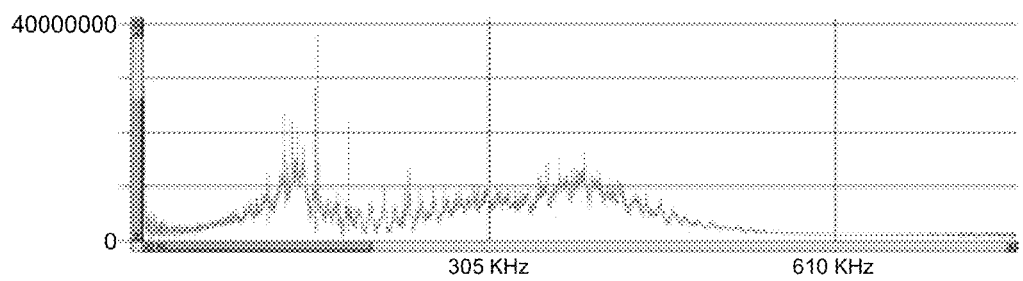
Frequency response from eight averaged samples
FIG. 15B

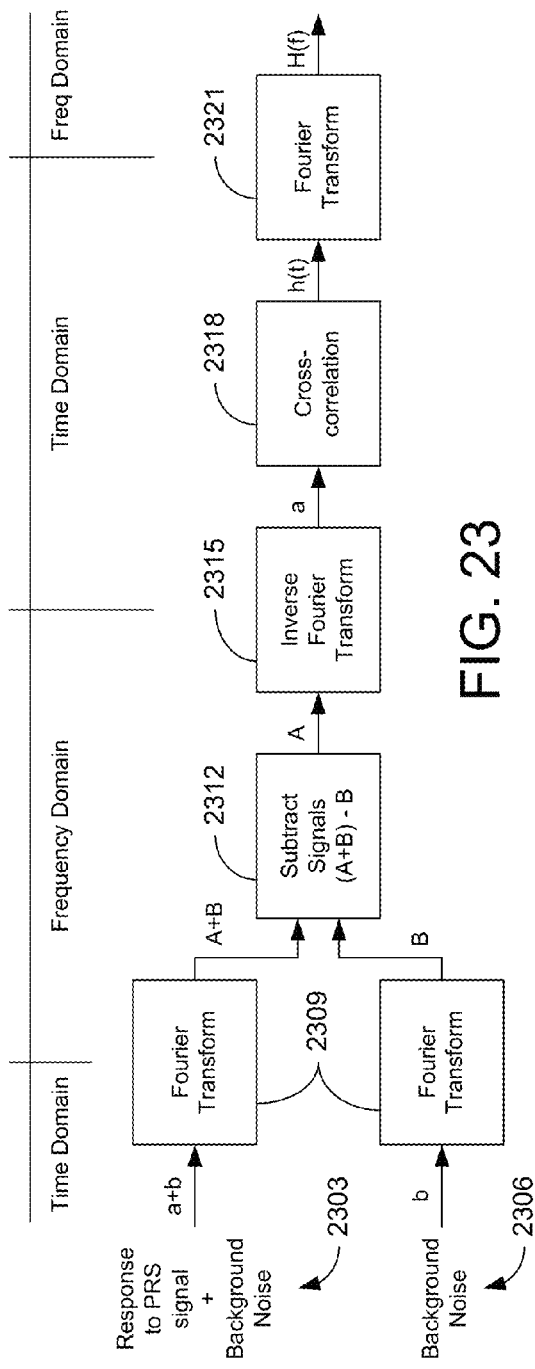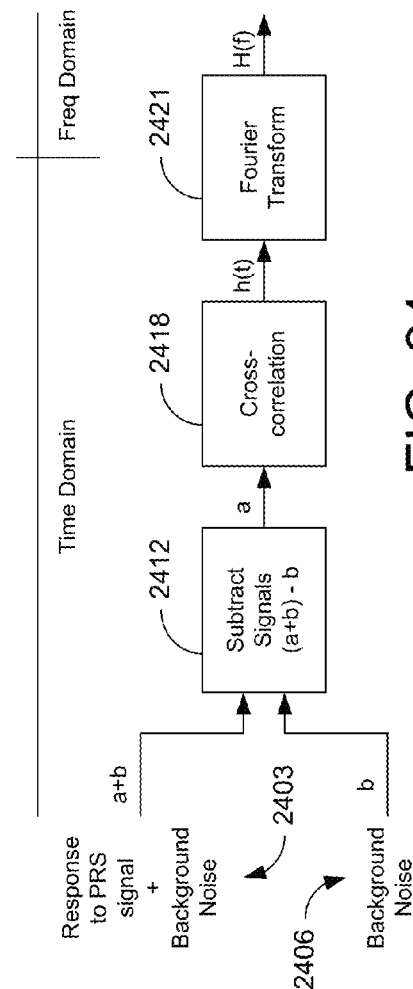

MONITORING AND ANALYSIS OF POWER SYSTEM COMPONENTS

BACKGROUND

Electric utilities operating a power grid often test connected equipment to determine the operating condition. In many cases, this requires that the equipment be disconnected from the power grid before testing may be carried out. For example, testing of a carrier trap can require numerous man-hours to remove the carrier trap from service before the test is carried out and restore the carrier trap after the test is completed. In addition, such testing can disrupt service patterns within the power grid during that time.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 14A-14B and 15A-15B are graphical plots of examples of data obtained using the system of FIG. 12 according to various embodiments of the present disclosure.

FIGS. 23 and 24 illustrate noise reduction with raw RF signals captured with and without PRS signal injection according to various embodiments of the present disclosure.

DETAILED DESCRIPTION

Figure 1:
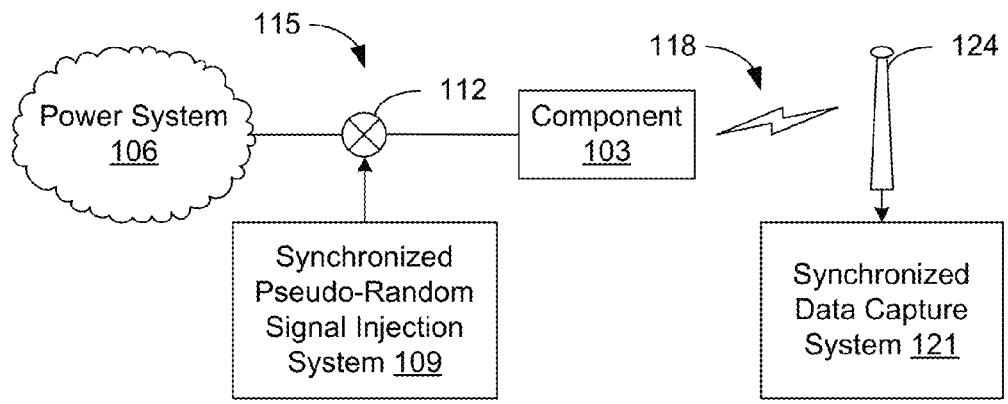
FIG. 1 is a drawing of a system for impulse response and frequency monitoring of an electrical component in a power system according to various embodiments of the present disclosure.

Disclosed herein are various embodiments of methods related to impulse response monitoring in power systems. Reference will now be made in detail to the description of the embodiments as illustrated in the drawings, wherein like reference numbers indicate like parts throughout the several views.

Introducing a low level of electrical white noise to a power system can cause an electrical element or component of the system to resonate (or ring) at their characteristic frequencies, producing electromagnetic transmissions from the electrical component. The resulting resonant response may be captured by an antenna or other appropriate sensor. The captured signal can be analyzed to identify and monitor characteristics of the electrical component being stimulated by the introduced signal. The power system components can include, but are not limited to, carrier traps, coupling capacitor voltage transformers (CCVT), tap-changing transformers, transmission lines, and other power system components as can be appreciated. Using pattern recognition techniques, characteristics of the electrical component can be identified without removal from the power system. Such detection and identification may be carried out continuously and in real time.

Referring to FIG. 1, shown is a graphical representation illustrating impulse signal injection for monitoring an electrical component 103 coupled to a power system 106 in accordance with various embodiments of the present disclosure. Independent of the power flow through the power system 106, a pseudo-random sequence (PRS) signal is injected by system 109 into the power system component 103 through a power system interface 112 in a transmission path 115 (e.g., a HV transmission line, bus, or other appropriate access point) coupled to the power system component 103. In some cases, the power system interface 112 is located where the power system component 103 is coupled to the transmission path 115. The injected signal is a relatively low-level noise signal such as a PRS signal. The injected signal excites low level wireless radio frequency (RF) transmissions 118 from the power system component 103 that may be captured by a wireless data capture system 121 through an RF antenna 124. The PRS signal injection system 109 and the wireless data capture system 121 are synchronized to facilitate analysis of the captured data.

The impulse response of the component 103 can be determined by cross-correlating the captured data with the additive random noise input signal. Pseudo-random discrete interval binary noise sequences can be used effectively as the noise input signal. Using cross-correlation and other techniques on the sampled data, impulse and frequency response characteristics of the power system and its components can be determined. For example, taking a Fourier transform of the impulse response yields the frequency response of the system.

Figure 2:
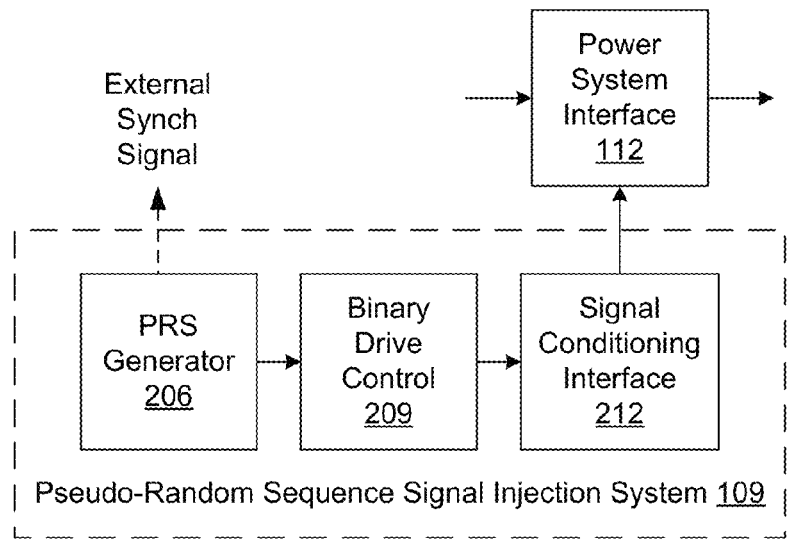
FIG. 2 is a graphical representation illustrating an example of synchronized pseudo-random sequence (PRS) signal injection into the electrical component of FIG. 1 according to various embodiments of the present disclosure.
Figure 3:
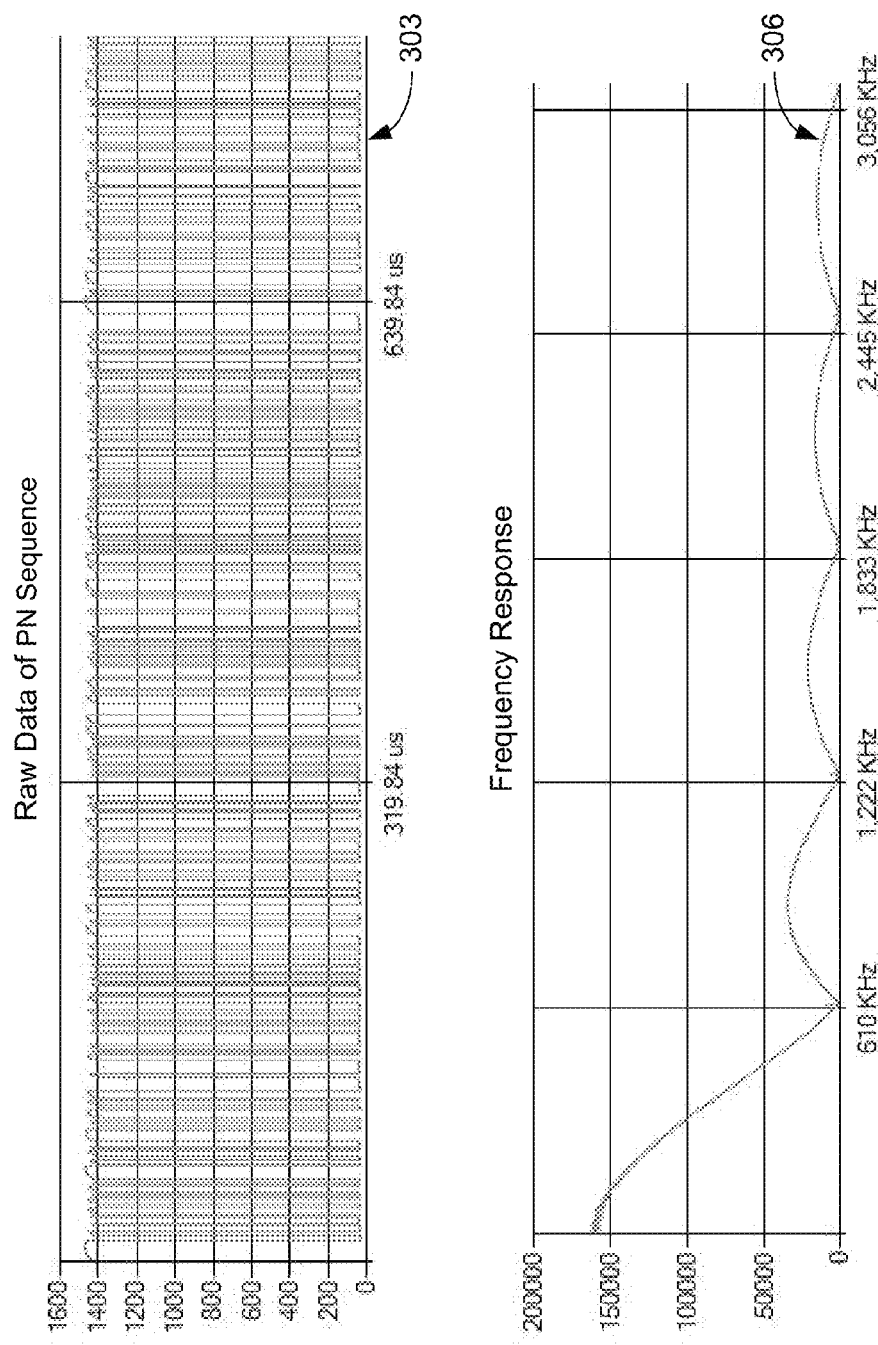
FIG. 3 is graphical plots of an example of a PRS for injection into the electrical component of FIG. 1 according to various embodiments of the present disclosure.

Referring next to FIG. 2, shown is an example of a system for synchronized PRS signal injection 109 into the electrical component 103. In the embodiment of FIG. 2, periodic synchronization pulses based upon the start of the PRS signal may be provided, e.g., by a PRS generator 206. The PRS generator 206 may also provide an external synchronizing signal for data capture synchronization. The periodic synchronization pulses are used to coordinate the injection of a pseudo-random noise (PN) sequence into the component 103 through power system interface 112. Unlike a pure white noise signal (i.e., a purely random signal) with energy spread equally at all frequencies, the frequency response of a pseudo-random discrete interval binary signal is a classic sin(x)/x shaped waveform. An example of a PRS signal is illustrated in FIG. 3. A portion of the raw data 303 of a PN9 signal at a bit rate clock frequency of 625 kHz is depicted in the top trace. The resulting frequency spectrum 306 is shown in the bottom trace. The zero points on the frequency spectrum 306 occur at multiples of the bit rate clock frequency (i.e., n×625 kHz; n=1, 2, . . . ). Longer PN sequences have statistical characteristics that more closely approximate those of pure random noise waveforms and tend to produce better quality calculated impulse and frequency responses.

Referring back to FIG. 2, the PRS generator 206 is configured to control the bit rate clocking and generation of the PRS. The PRS generator 206 may provide PRS at one or more bit length(s), e.g., PN9, PN10, PN11, and PN12 sequences, for injection into the power system 106. In some embodiments, PRS bit lengths range from PN6 to PN17 (or greater) where the PN sequence length is $2^n-1$ for a selected PNn. In some implementations, the PN sequence length may be selectable.

The bit rate clock frequency may also be selectable from a range of frequencies. TABLE 1 provides examples of PRS durations at various bit lengths and bit rate clock frequencies that may be utilized. Higher bit rate clock frequencies and/or longer PN bit lengths result in captured data that yields more detail in the calculated impulse and frequency responses.

The duration of the PRS is the bit clock period times the bit length of the sequence. Cross-correlations of impulse responses are more effective when the duration of the PRS is longer than the response of the electrical power system component 103 to an impulse. So the combination of bit rate and sequence length should be chosen such that the PRS length in time exceeds the total time for a component's impulse response to die out. In the examples of TABLE 1, the PRS durations range from a duration of 204.4 microseconds to 26.21 milliseconds.

Figure 4:
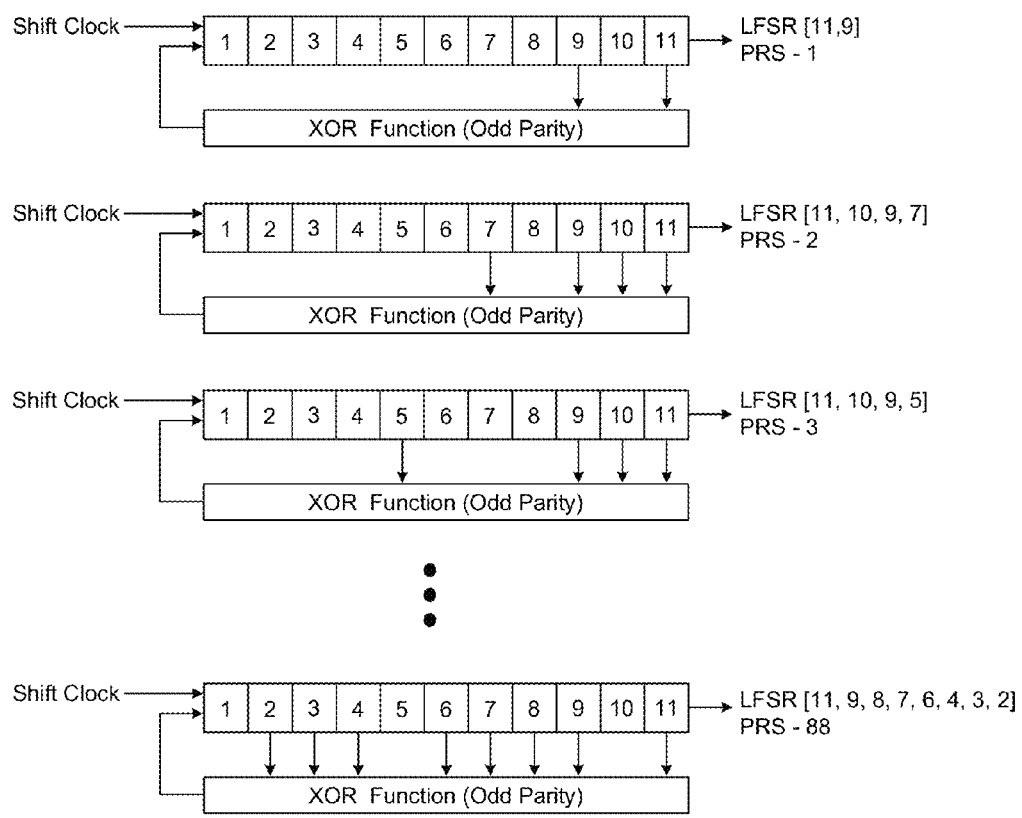
FIG. 4 is a graphical representation illustrating an example of generating various uncorrelated PRS signals in the PRS generator of FIG. 2 using a linear feedback shift register (LFSR) in accordance with various embodiments of the present disclosure.

FIG. 4 illustrates an example of generating various uncorrelated PRS signals in the PRS generator 206 using a linear feedback shift register (LFSR) in accordance with various embodiments of the present disclosure. In the embodiment of FIG. 4, an 11-bit LFSR is used to produce PN11 sequences. A shift clock (e.g., the bit clock) is used to clock the shift register. An "exclusive OR operation" (XOR, odd parity) on selected output from the various stages of the shift register provides a feedback signal to the beginning stage of the shift register. Only certain selected outputs will produce maximum length LFSR sequences that are pseudorandom. In the case of the 11-bit LFSR of FIG. 4, 88 unique PN11 sequences (PRS-1, PRS-2, PRS-3 . . . , and PRS-88) may be created.

Referring back to FIG. 2, the PRS is supplied to a binary drive control 209 for injection of the PN sequence into the component 103 at a low voltage level (e.g., less than about 100 V). In some embodiments, the drive control 209 injects the PN signal at a low voltage level of about 100 V peak-peak, about 50 V peak-peak, about 30 V peak-peak, about 25 V peak-peak, about 15 V peak-peak, or at other low voltages as can be appreciated. The binary drive control 209 may continuously inject a stream of PRS signals marked by a synchronizing pulse. A description of a PRS generator 206 and a binary drive control 209 of a PRS signal injection system 106 are provided in U.S. patent application Ser. No. 12/645,853, filed on Dec. 23, 2009 and entitled "Pseudorandom Binary Discrete Interval Noise Signal Generation and Injection on to the Electric Power Grid," which is hereby incorporated by reference in its entirety. In one embodiment, the specifications of a binary drive control 209 include a frequency range from DC to about 1 MHz, a frequency response of less than +/−0.1 dB, distortion of less than 0.1%, a maximum voltage of about 140 Vrms (OC), a voltage gain of about 0 dB to about 40 dB, a variable DC offset of about 0V to +/−200V peak, continuous output power of about 75 Watts, and short circuit protection. In some embodiments, a signal conditioner and a power amplifier with an adjustable gain may be used in place of the binary drive control 209.

A signal conditioning interface 212 is provided between the power system interface 112 and the output of the binary drive control 209 to protect the PRS injection equipment from

TABLE 1

Figure 5:
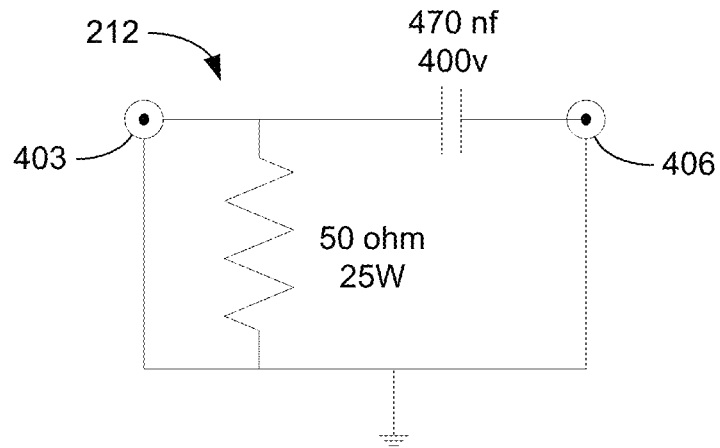
FIG. 5 is a graphical representation illustrating an example of a signal conditioning interface of FIG. 2 according to various embodiments of the present disclosure.

| | | Data sample rate at 10X | | | | |
|---|---|---|---|---|---|---|
| | | 40 ns | 80 ns | 160 ns | 320 ns | 640 ns |
| | | | PRS bit clock period | | | |
| | | 400 ns | 800 ns | 1600 ns | 3200 ns | 6400 ns |
| | | | PRS bit clock frequency | | | |
| | Bit length | 2.5 MHz | 1.25 MHz | 625 kHz | 312.5 kHz | 156.25 kHz |
| PN9 | 511 | 204.4 μs | 408.8 μs | 817.6 μs | 1.64 ms | 3.27 ms |
| PN10 | 1023 | 408.8 μs | 817.6 μs | 1.64 ms | 3.27 ms | 6.55 ms |
| PN11 | 2047 | 817.6 μs | 1.64 ms | 3.27 ms | 6.55 ms | 13.10 ms |
| PN12 | 4095 | 1.64 ms | 3.27 ms | 6.55 ms | 13.10 ms | 26.21 ms | the power flow on the power system 106 (FIG. 1), as well as to avoid interference with power line carriers and transfer trip systems. FIG. 5 illustrates one example, among others, of a signal conditioning interface 212, which includes passive elements to provide protection. An R-C filter may be used for signal conditioning and passive series notch filters may be used to remove power line carrier signals. The embodiment of FIG. 5 depicts R-C signal conditioning with a 50 ohm resistor and a 470 nf capacitor. Signals from the binary drive control 209 are obtained at connection 403 and conditioned signals are provided to the power system interface 112 from connection 406.

The use of a signal conditioning interface 212 (FIG. 2) will alter the PRS signal waveform injected into the component 103 (FIG. 1). However, due to the deterministic nature of the effects on the PRS signal, the effects of a signal conditioning interface 212 can be compensated for during analysis of the captured data based upon simulated and/or measured characteristics of the signal conditioning interface 212.

Figure 6:
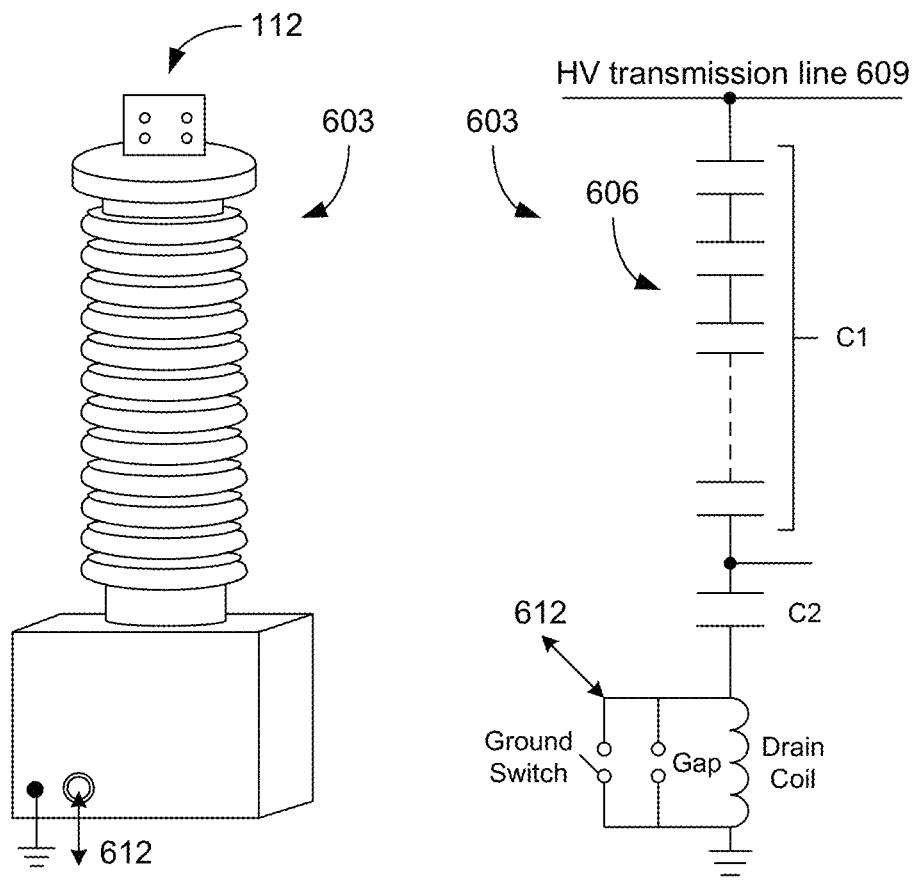
FIG. 6 is a graphical representation illustrating an example of a coupling capacitor voltage transformer (CCVT) used as a power system interface of FIG. 2 according to various embodiments of the present disclosure.

Referring back to FIG. 2, the conditioned PRS signal from the signal conditioning interface 212 is added to the power line carrier signals of the power system 106 through the power system interface 112. A power system interface 112 may be, for example, a coupling capacitor voltage transformer (CCVT) that is coupled to the signal conditioning interface 212 and the transmission path 115 (FIG. 1) of the power system 106. FIG. 6 provides a graphical representation of an example of a CCVT 603 and a diagram illustrating a connection of the CCVT 603 to a high voltage transmission line 609 of the power system 106. A stack of capacitors 606 in the CCVT 603 facilitates injection of the low voltage PRS signal into a high voltage bus or transmission line 609 or a coupling point of the component 103 (FIG. 1). The conditioned PRS signal from the signal conditioning interface 212 is provided for injection across the drain coil of the CCVT 603 through connection 612.

Testing of an electrical component 103 may also be carried out without the component 103 being coupled to the power system 106. In this case, the PRS signal may be provided to terminals of the component 103 with or without the use of a signal conditioning interface 212. In some embodiments, a power amplifier may be used to amplify the generated PRS signal in place of the binary drive control 209. The amplified PRS signal may be applied directly to the terminals of the electrical component 103 or through a signal conditioner (e.g., a filter) as appropriate.

Figure 7:
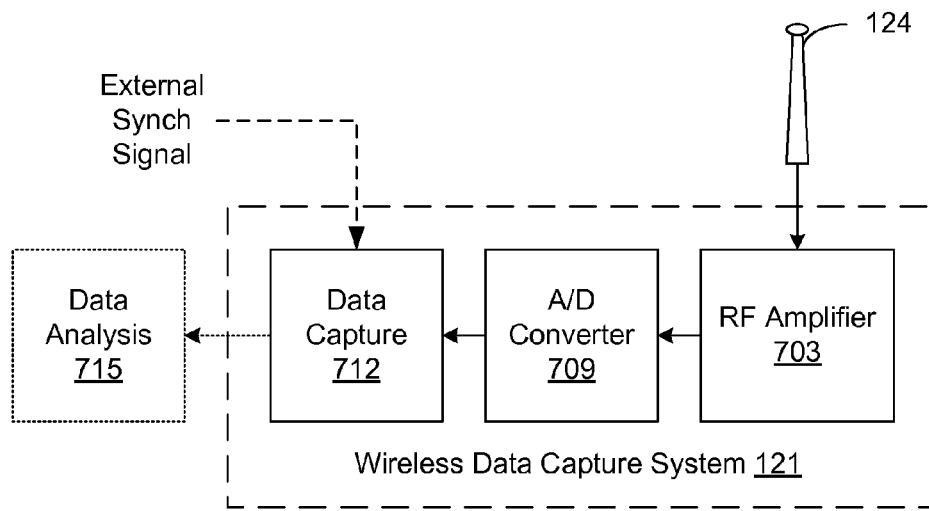
FIG. 7 is a graphical representation illustrating an example of a synchronized wireless data capture system of FIG. 1 according to various embodiments of the present disclosure.

Referring next to FIG. 7, shown is an example of a system for synchronized wireless data capture 121 from the electrical component 103. In the embodiment of FIG. 7, the response to the injected PRS signal is obtained through an RF antenna 124. Excitation of the electrical component 103 by the injected PRS signal radiates wireless RF signals that can be obtained through the RF antenna 124. An RF amplifier 703 provides impedance matching between the antenna 124 and the wireless data capture system 121 as well as amplifying the received RF signals for acquisition and processing. The gain of the RF amplifier 703 may be controlled to improve signal acquisition by the wireless data capture system 121. In some implementations, the captured signal may be low pass filtered to reduce high frequency noise and interference from other RF transmissions such as, e.g., AM radio stations.

The PRS signal injection system 106 (FIG. 2) and wireless data capture system 121 (FIG. 7) are synchronized to facilitate analysis of the captured raw RF component data. As illustrated in FIG. 7, periodic synchronization pulses based upon timing synchronization such as, e.g., an external synchronous signal provided by the PRS signal injection system 109 (FIG. 2). The periodic synchronization pulses are used by an analog-to-digital (A/D) converter 709 and data capture 712 to synchronously sample and store the raw RF component data from the amplified RF signal provided by the RF amplifier 703. The sampled data may be buffered for capture. For example, a Picoscope ADC-212, a Picoscope 4226, or other appropriate system may be used to sample and buffer the raw RF component data.

In response to a trigger from the PRS generator 206, the raw RF component data is captured and stored by data capture 712. Other triggers may be utilized as can be appreciated. In some implementations, a predefined amount of raw RF component data may be block captured in response to the trigger. For example, the block size may be the PRS length times an oversample rate. In other embodiments, the amount of captured raw RF component data may vary based upon the length of the PRS and/or other conditions of the electrical component 103. In some embodiments, raw RF component data corresponding to consecutive PRS signals in a stream of PRS signals are captured to determine the correlated impulse response. In some cases, buffering by the ND converter 709 may allow capture of data that was sampled before triggering. In some embodiments, the A/D converter 709 may be included in the data capture 712.

Data capture 712 may be, e.g., a hardware device, a data logger, a computing device such as, e.g., a laptop, workstation, smartphone, and/or other computing device that is configured to execute a data capture application, or other circuit or device as can be appreciated. Data capture is synchronized to the beginning of the injected PRS. The data capture 712 may also be configured to analyze the captured raw RF component data (e.g., by execution of a data analysis application) or a separate data analysis system 715 (e.g., another computing device configured to execute a data analysis application) may obtain the captured raw RF component data for analysis. For example, a computer may obtain the captured data from a Picoscope 4226 which includes the data capture 712 through, e.g., a USB, Bluetooth, WiFi, Ethernet, or other appropriate connection. In some implementations, the PRS signal injection system 109 and/or wireless data capture system 121 may be adjusted based upon the captured and/or analyzed data to improve data capture. In some embodiments, the captured data may be stored in a data store for subsequent analysis.

Figure 8:
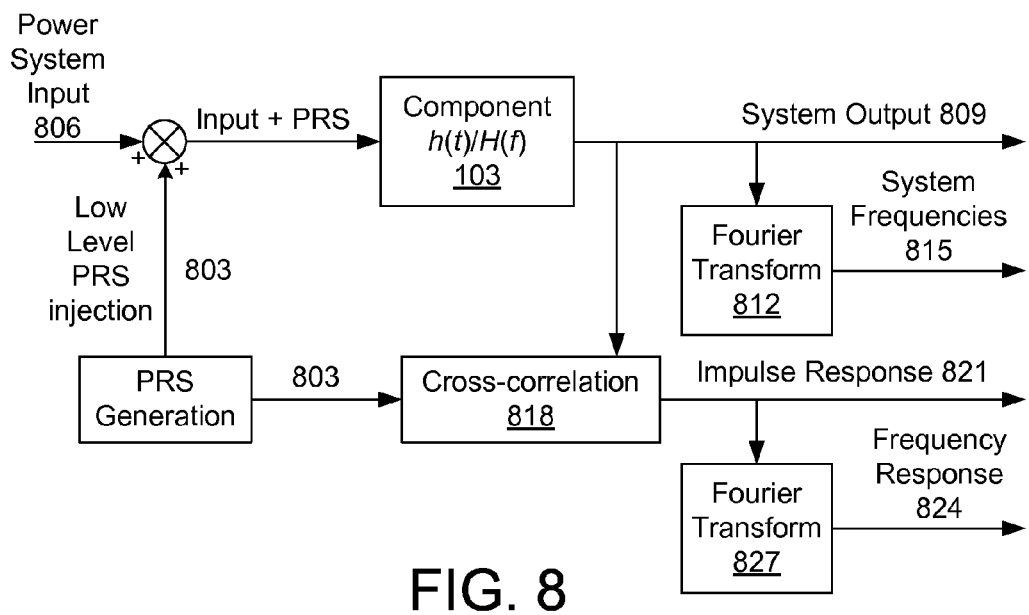
FIG. 8 is a graphical representation illustrating an example of signal analysis for the system of FIG. 1 according to various embodiments of the present disclosure.

Referring to FIG. 8, shown is a diagram illustrating an example of signal analysis for the power system component 103 of FIG. 1. As shown, a low level PRS signal 803 provided by PRS injection system 109 of FIG. 1 may be combined with the power system input 806 supplied to the power system component 103 while it is connected to the power system 106 (FIG. 1). If the power system component 103 is not connected to the power system 106, the PRS signal may be supplied directly to the power system component 103. Excitation of the power system component 103 by the PRS signal 803 generates electromagnetic transmissions that may be obtained as raw RF component data through a RF antenna by the wireless data capture system 121 of FIG. 7. The raw RF component data may be examined directly as the system output 809 or may be processed using a Fourier transform 812 to examine the frequency spectrum 815 of the captured raw RF component data. The captured raw RF component data may also be cross-correlated 818 with the PRS signal 803 to provide an impulse response h(t) 821 for the power system component 103. The frequency response H(f) 824 may be determined using a Fourier transform 827 to process the impulse response. The impulse response h(t) 821 and frequency response H(f) 824 may also include information about the other components such as the power system interface 112 (FIGS. 1 and 2) through which the PRS passes.

The correlated impulse response waveform is determined by cross-correlating the captured raw RF component data with the corresponding PN sequence. A frequency response may then be determined using the determined impulse response. The cross-correlation determination may be calculated in real-time. The correlated impulse response waveform and frequency response may then be used to determine a condition of the component 103. For example, the resonant frequency of a carrier trap may be identified from the frequency response waveform. In addition, the phase angle information may be used to identify characteristics of the power system component 103. The condition of the component 103 may also be evaluated by comparing changes in the impulse response and frequency response over time. Other components 103 such as, e.g., CCVTs, capacitor banks, transformers, etc. may be evaluated based upon their impulse response and frequency response waveforms. Moreover, such an evaluation may be carried out without removing the component 103 from service in the power system 106.

The condition of the component 103 may be determined based upon characteristic frequencies and/or the impulse response associated with the component 103. By using a range of frequencies (or sub-ranges of frequencies) as the characteristic frequencies, a pattern recognition algorithm or neural network may be used to determine the condition of the component 103. For example, changes in the distribution of magnitudes within the characteristic frequency range may be associated with a condition of the component 103 by pattern recognition. In other implementations, a neural network may be trained to provide an indication of the component's condition based upon learned patterns within the frequency range. Training data may be provided based upon measured data or from simulation results. In some embodiments, multiple characteristic frequency components (or frequency ranges) may be recognized as characterizing a component 103 within the power system 106, and may be used to determine a condition (e.g., the presence of a fault) of the component 103. Patterns within the correlated impulse response may also be examined using pattern recognition and/or neural network evaluation to identify the condition of the component 103.

In addition, least squares analysis of correlated impulse response waveforms and/or frequency spectrums may also be used to determine condition of the component 103. For example, the least squares difference between the two most recent impulse response waveforms (and/or frequency spectrums) may be calculated. Excursions in the least squares difference indicate a change in the component 103 while constant values illustrate repeatability of the impulse responses (and/or frequency spectrums). In some embodiments, a plurality of sequential least squares differences may be displayed to illustrate trending of the impulse responses (and/or frequency spectrums) over time.

Raw RF component data, calculated impulse response data, and frequency response data may be stored in a data store for subsequent analysis and evaluation. In some implementations, captured RF component data may be used to provide real-time indications of the component condition and/or may be used to control component operation.

Figure 9:
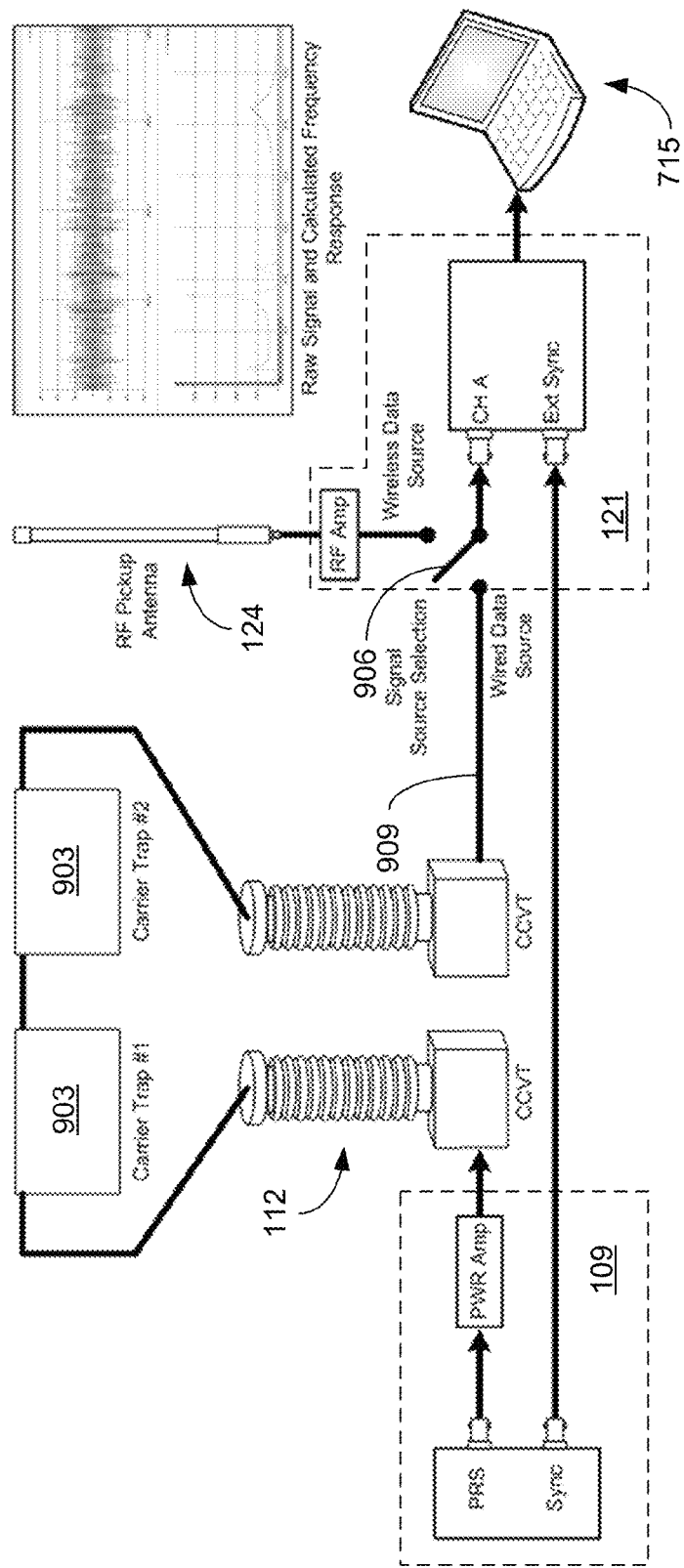
FIGS. 9, 12, 17, 19, and 20 are graphical representations illustrating examples of the system for impulse response and frequency monitoring of an electrical component of FIG. 1 according to various embodiments of the present disclosure.

To verify component monitoring and analysis using the PRS signal injection system 109 and wireless data capture system 121, raw RF component data captured with the wireless data capture system 121 was compared with raw component data captured from a wired connection to the power system components in a controlled setting. Referring to FIG. 9, shown is an example of a setup used to obtain the raw component data from a pair of off-line power line carrier (PLC) traps 903 connected in series for comparison. A PRS signal injection system 109 provided a PRS signal, which was conditioned by a power amplifier, to the pair of PLC traps 903 through a power system interface (CCVT) 112. An external synchronizing signal was provided by the PRS signal injection system 109 to the wireless data capture system 121 for synchronization of the PRS signal and the captured data to facilitate analysis. Raw component data was captured through a source selector 906, which could be switched between an RF antenna 124 and a wired connection 909 to the pair of PLC traps 903 through a second CCVT. Raw component data was initially captured by the wireless data capture system 121 through the wired connection 909. Low level wireless RF transmissions from the pair of PLC traps 903 were then captured by the wireless data capture system 121 through the RF antenna 124. The captured raw component data was then analyzed and compared using a data analysis system 715.

Figure 10:
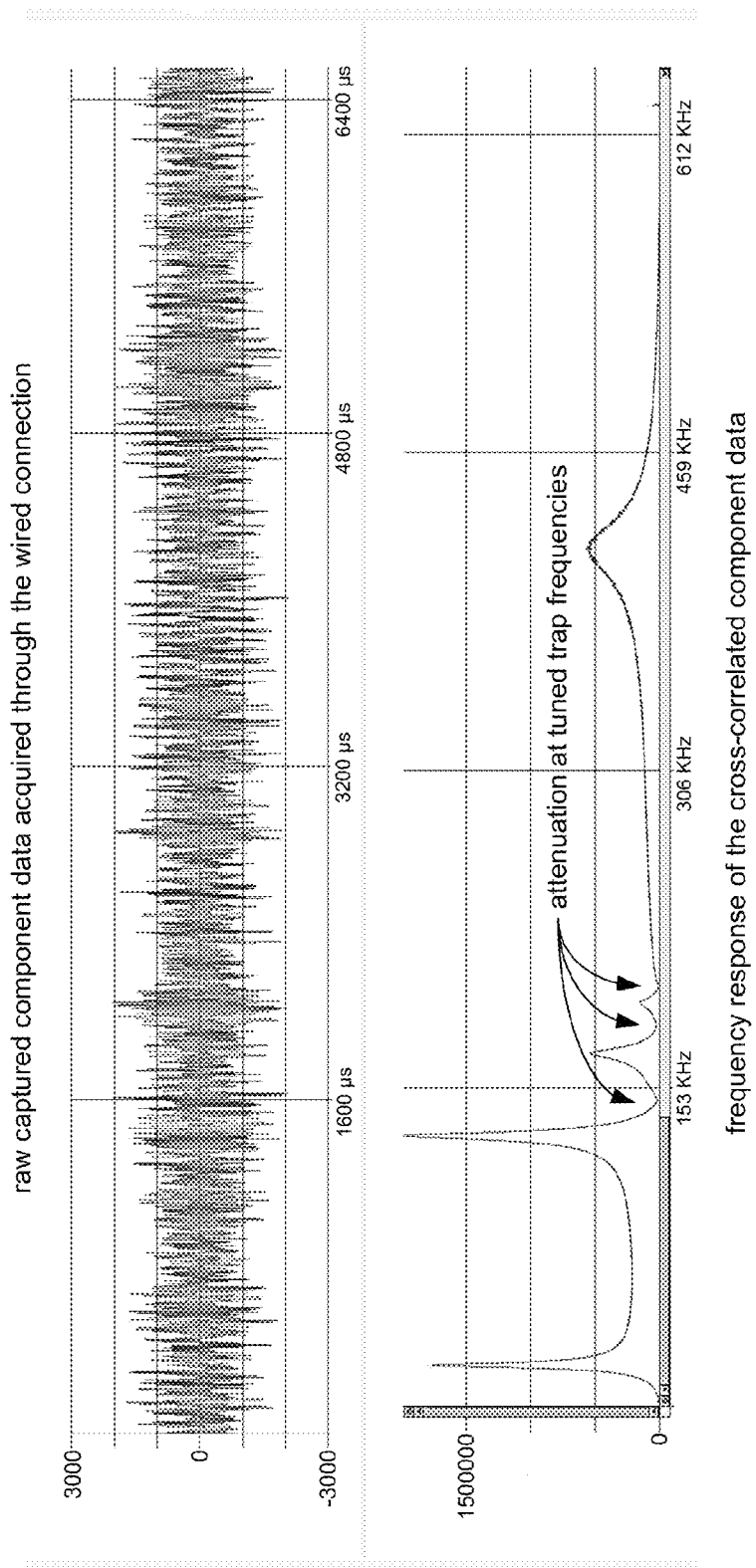
FIGS. 10 and 11 are graphical plots of examples of the captured raw data and corresponding frequency response using the system of FIG. 9 according to various embodiments of the present disclosure.
Figure 11:
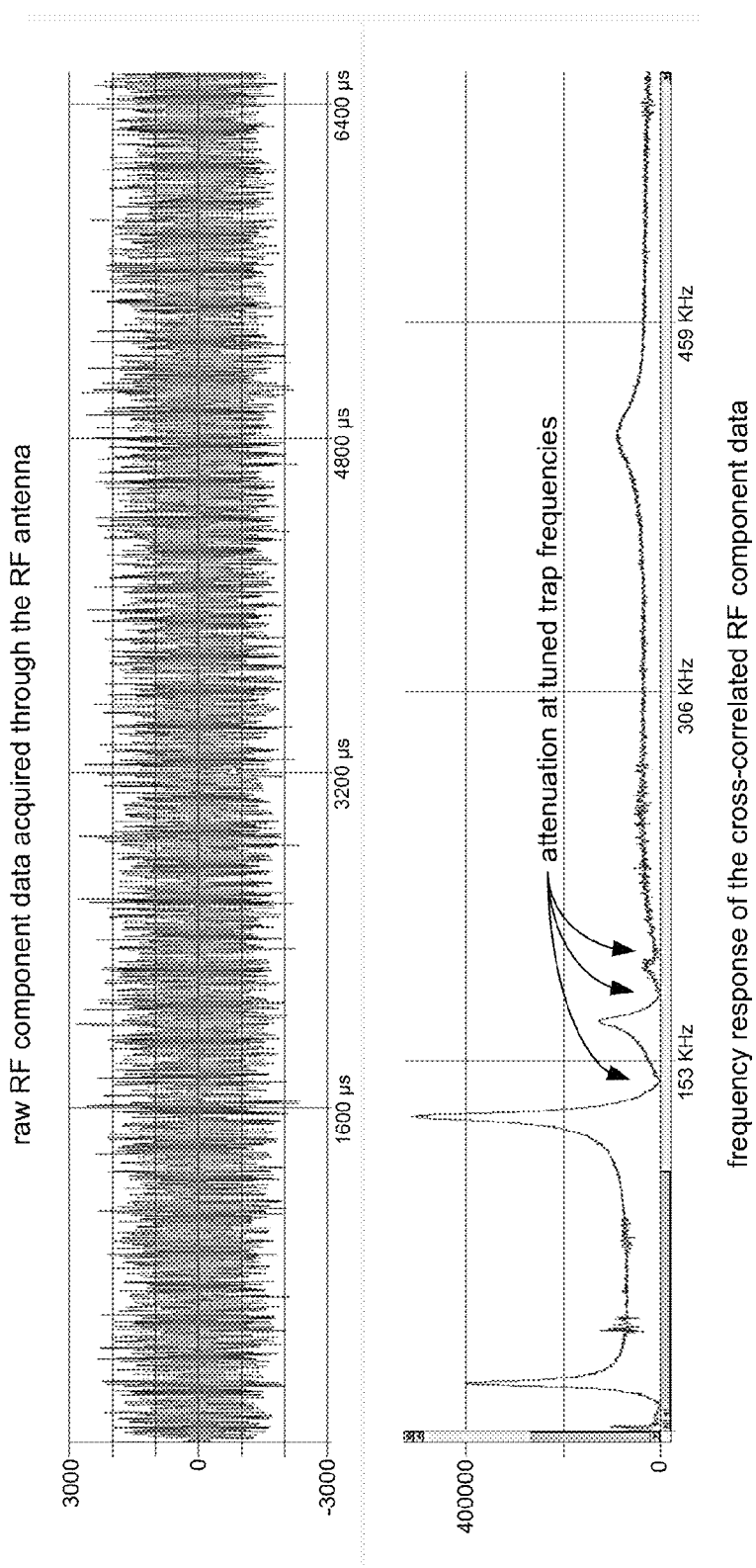

Referring to FIG. 10, shown is an example of the raw captured component data acquired through the wired connection and the frequency response of the cross-correlated component data. Frequency characteristics of the pair of PLC traps 903 (FIG. 9) such as, e.g., the attenuation at the tuned trap frequencies can be seen in the frequency response of the cross-correlated component data. FIG. 11 shows an example of the raw RF component data acquired through the RF antenna 124 (FIG. 9) and the frequency response of the cross-correlated RF component data. As can be seen by comparing FIGS. 10 and 11, the same frequency characteristics of the pair of PLC traps 903 including, e.g., the attenuation at the tuned trap frequencies are present in the frequency response of the cross-correlated RF component data. In addition, frequency components associated with 60 Hz and higher frequency RF background emissions are also evident in the cross-correlated RF component data.

Figure 12:
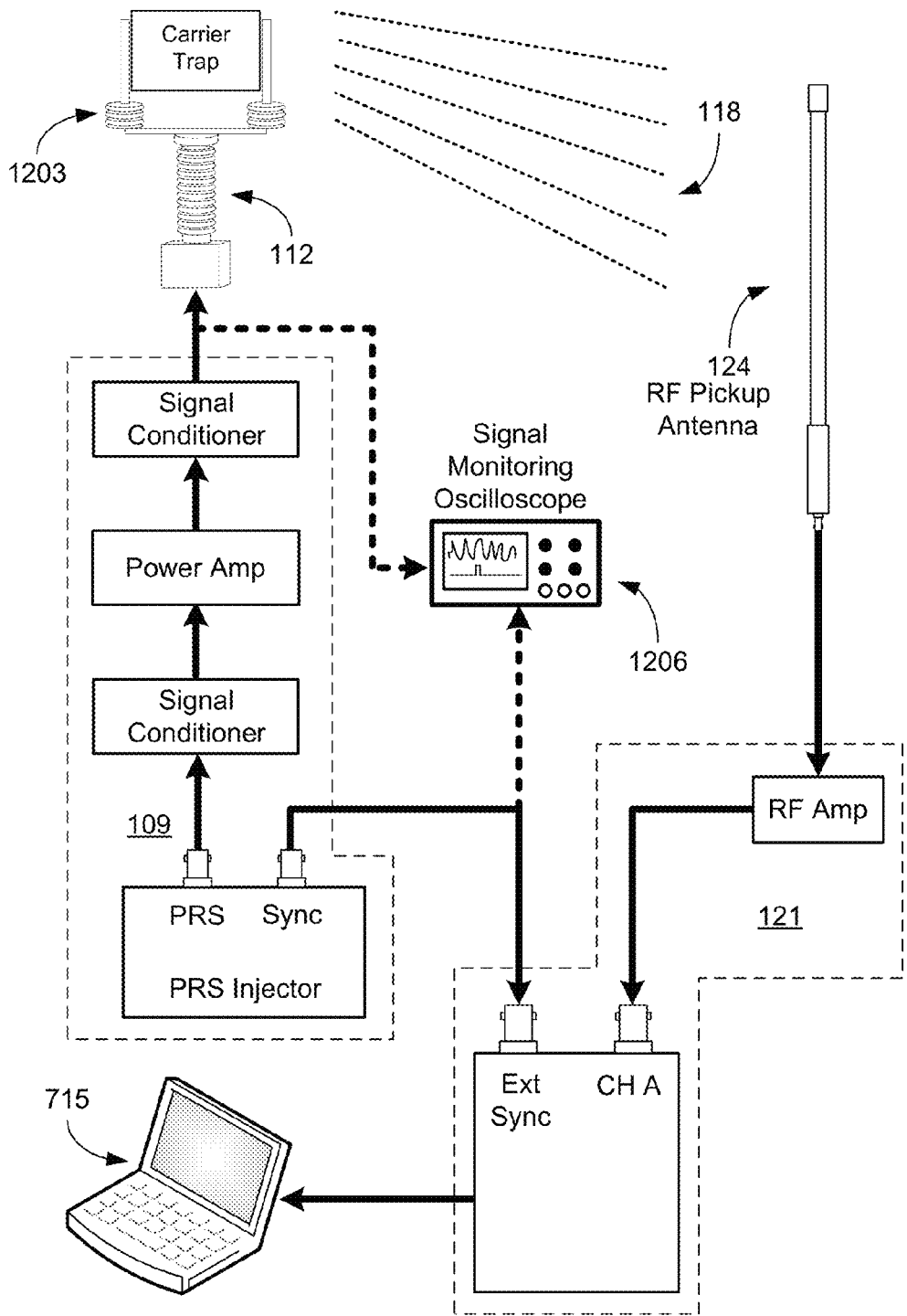

Field testing of the PRS signal injection system 109 and wireless data capture system 121 was carried out at an operating power system substation. Referring to FIG. 12, shown is an example of a setup for wireless monitoring and analysis of an electrical power system component 103 (FIG. 1). In the example of FIG. 12, wireless monitoring and analysis was carried out on a PLC trap 1203. A PRS signal injection system 109 provided a PRS signal, which was conditioned by signal conditioners and a power amplifier, to the PLC trap 1203 through a power system interface (CCVT) 112. An external synchronizing signal was provided by the PRS signal injection system 109 to the wireless data capture system 121 for synchronization of the PRS signal and the captured raw RF component data to facilitate analysis. An oscilloscope 1206 may be triggered using the external synchronizing signal to monitor, e.g., the effect of the signal conditioning and power amplification on the PRS signal. In some implementations, the amplitude of the PRS signal injected into the PLC trap 1203 via the power system interface 112 may also be monitored by the oscilloscope 1206. The injected PRS signal excites low level wireless RF transmissions 118 from the PLC trap 1203 that can be captured by the wireless data capture system 121 through the RF antenna 124.

Figure 13:
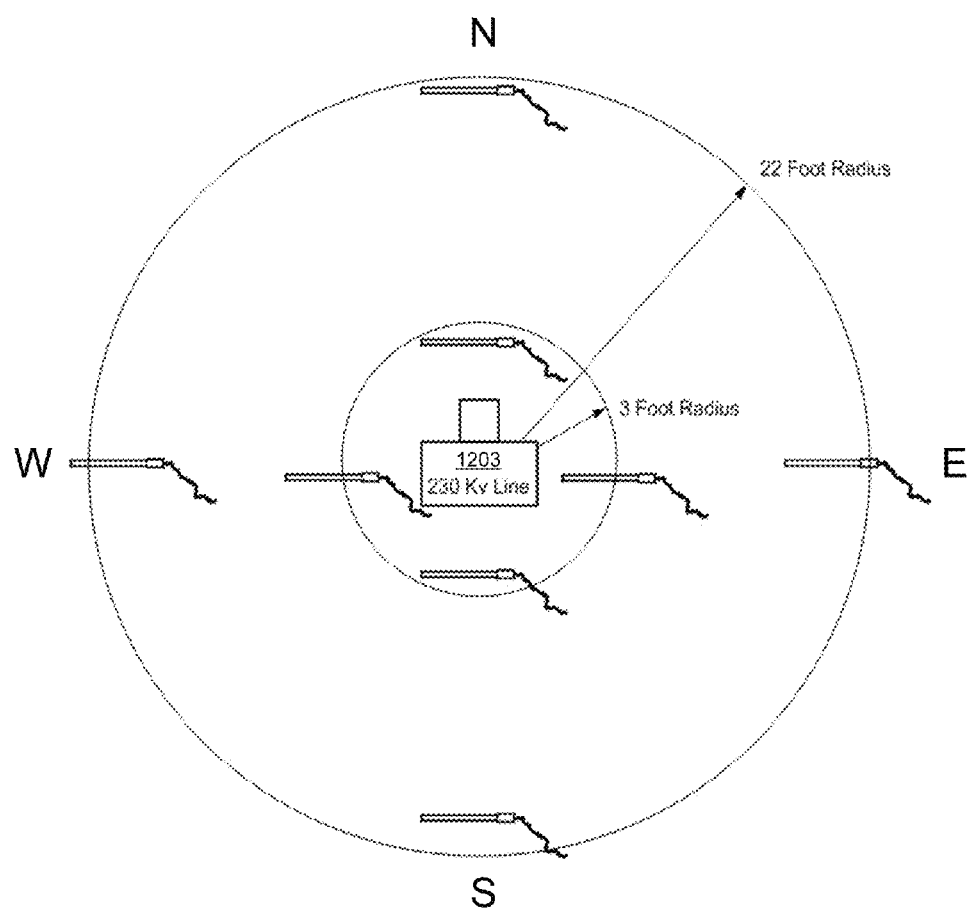
FIG. 13 is a graphical representation illustrating raw data capture locations using the system of FIG. 12 according to various embodiments of the present disclosure.

During monitoring, a PRS signal was injected into an operating PLC trap 1203 while raw RF component data was collected at multiple locations around the PLC trap 1203. A 4095 bit long, PN12, binary 30 Volt peak-to-peak PRS clocked at a bit rate of 625 KHz was injected into the PLC trap 1203 connected to a 230 KV line across CCVT 112 drain coil. The radiated RF energy was captured through the RF antenna 124 and an impedance matching RF amplifier. Samples of raw RF component data were collected at eight locations under the PLC trap 1203 on the 230 KV line as illustrated in FIG. 13. Four sets of sequential data samples were taken at a three foot radius and four sets were taken at a 22 foot radius. For example, a series of repeated PRS signals may be injected in response to the synchronizing signal and corresponding sets of sequential data samples can be obtained using the wireless data capture system 121. Data capture is synchronized to the beginning of each PRS signal using, e.g., the external synchronizing signal. Each captured data sample contained 40950 digitized waveform values of the raw RF signal, which corresponds to the length of the injected PRS with 10× oversampling. Different oversampling amounts may also be used in other implementations. The raw data samples contain RF signals and noise from many sources including the RF energy from the injected PRS signals as well as signals from the surrounding area. While the orientation of the RF antenna 124 did not appear to affect the raw data captured by the wireless data capture system 121, it was found that placing the RF antenna 124 close to the ground reduced the 60 Hz components from the power system.

Figure 14A:
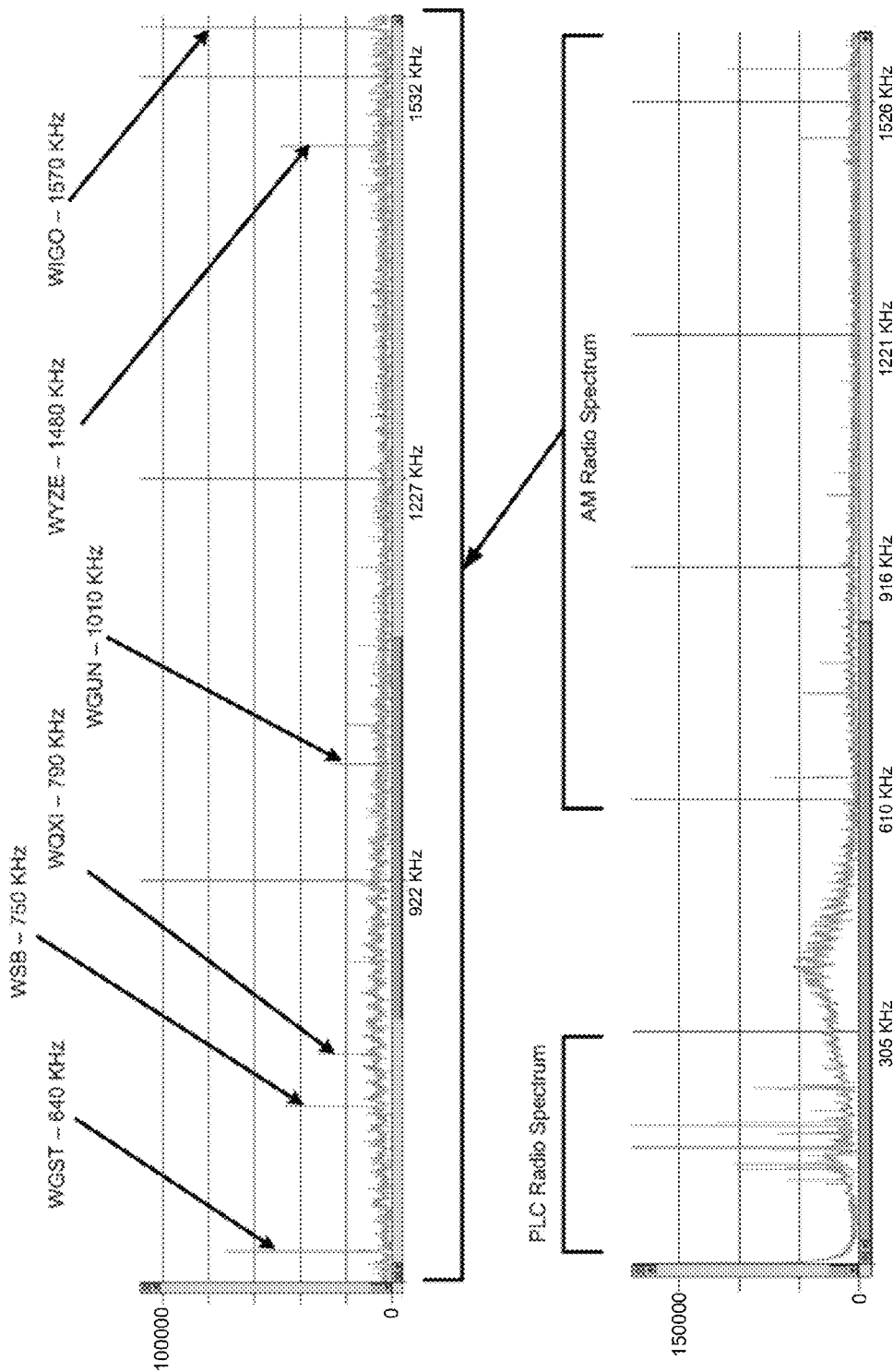
Figure 14B:
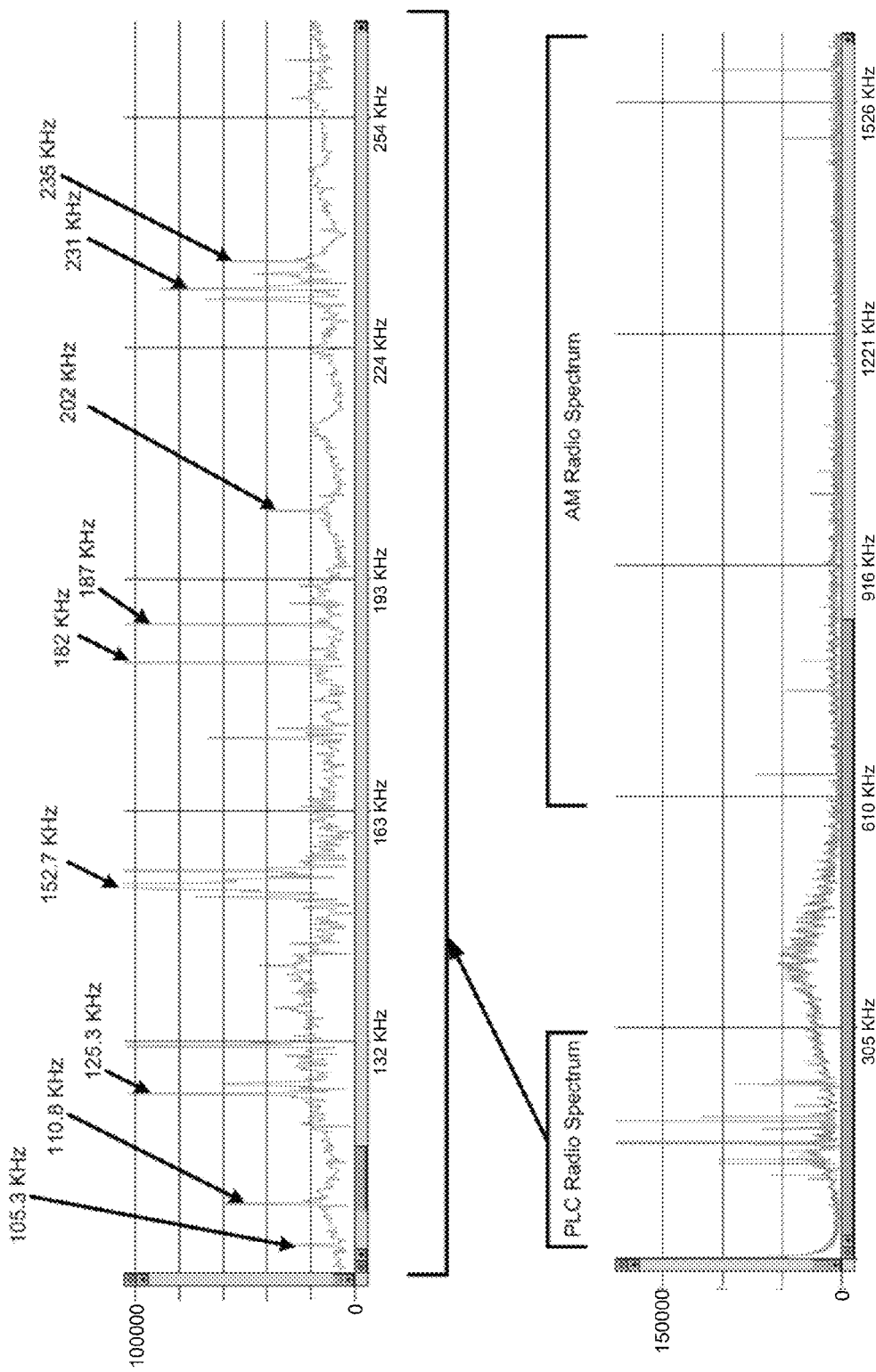

Referring to FIGS. 14A and 14B, shown is an example of the frequency spectrum of a raw data sample obtained at the operating power system substation. Taking the Fourier transform of the raw data sample reveals the different frequencies that are present during data capture. For example, as illustrated in FIG. 14A, local AM radio stations at, e.g., 640 KHz and 750 KHZ transmit relatively strong RF signals in the AM radio spectrum that is captured in the raw data samples. These peaks may be used as calibration points on the raw waveform plots. In some implementations, a low pass filter may be used to remove the AM radio signals. As shown in FIG. 14B, the radio spectrum for the PLC trap 1203 is below the AM radio spectrum. By focusing on the PLC radio spectrum in FIG. 14B, various frequency components may be identified.

Cross-correlation of the raw RF component data captured by the wireless data capture system 121 and the PRS act as a filtering operation that allows the generation of an impulse response for the PLC trap 1203 and the CCVT 112. The determined impulse response may also be influenced by the transmission line connected to the PLC trap 1203, as well as a tuning unit connected to the CCVT 112. The impulse response is the time domain waveform of the system response between the injection point (e.g., the drain coil of the CCVT 112) and the data capture point. As illustrated in FIG. 8, a frequency response may also be determined from the impulse response.

Power system and other background emissions may be reduced by averaging multiple sets of the captured raw RF component data. Because the captured data is synchronized with the injected PRS, averaging the raw RF component data emphasizes the RF emission excited by the PRS while canceling out at least a portion of the other RF signals. Referring to FIG. 15A, shown are examples of the impulse response for a single raw data sample, two averaged raw data samples, four averaged raw data samples, and eight averaged raw data samples. As can be seen, the impulse responses appear very similar. However, this is not the case with the corresponding Fourier transforms. Referring to FIG. 15B, shown are examples of the frequency response for a single raw data sample, four averaged raw data samples, and eight averaged raw data samples. Taking the Fourier transform of the average of several raw samples minimizes or eliminates transient frequencies from the resultant waveform, while enhancing the presence of continuous frequencies. As can be seen from FIG. 15B, the magnitude of the dominant frequency component is reduced as the number of averages samples is increased, allowing for finer resolution of the spectral components.

Figure 16:
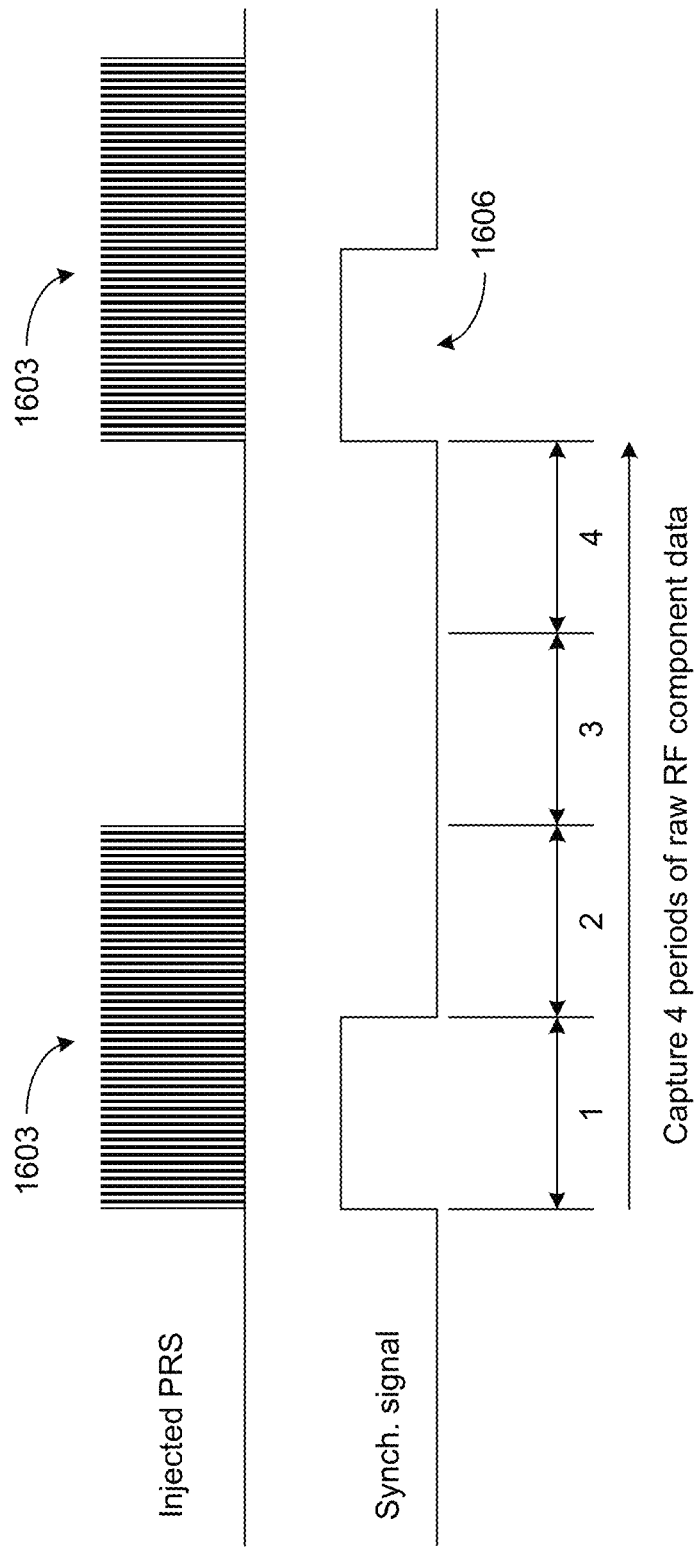
FIG. 16 illustrates an example of the capture of raw RF component data with and without the presence of an injected PRS signal according to various embodiments of the present disclosure.

Other methods may also be used to reduce or eliminate RF signals from other sources. For example, raw data may be captured with and without a PRS signal being injected into the monitored power system component. Referring to FIG. 16, shown is an example of the capture of raw RF component data with and without the presence of an injected PRS signal. A PRS signal 1603 is injected into the electrical component 103 followed by a defined period with no signal injection. In some implementations, a repeated series of PRS signals 1603 may be periodically injected. The PRS signal injection system 109 may be configured to alternate between injecting the PRS signal 1603 and no signal injection in response to the synchronizing signal 1606. The synchronizing signal 1606 triggers the capture of corresponding sets of sequential data samples with and without the injected PRS can be obtained using the wireless data capture system 121. In the example of FIG. 16, four sequential sets of raw RF component data are captured, two sets (periods 1 and 2) of raw data are captured including the response to the injected PRS signal 1603 followed by two sets (periods 3 and 4) of raw data without an injected signal response. Background noise is present in the captured raw data for all four periods. Frequency responses are determined for captured data with an injected PRS signal and without an injected PRS signal. For instance, the frequency response for periods 2 and 4 may be determined with the data captured in each period. By subtracting the frequency response data obtained from captured data without an injected PRS sequence (e.g., period 4) from the frequency response data obtained with a synchronized PRS injected (e.g., period 2), much of the background noise may be eliminated. Other patterns alternating between injecting the PRS signal and no signal injection may also be utilized. In addition, capture periods may be offset from the synchronizing signal.

Figure 17:
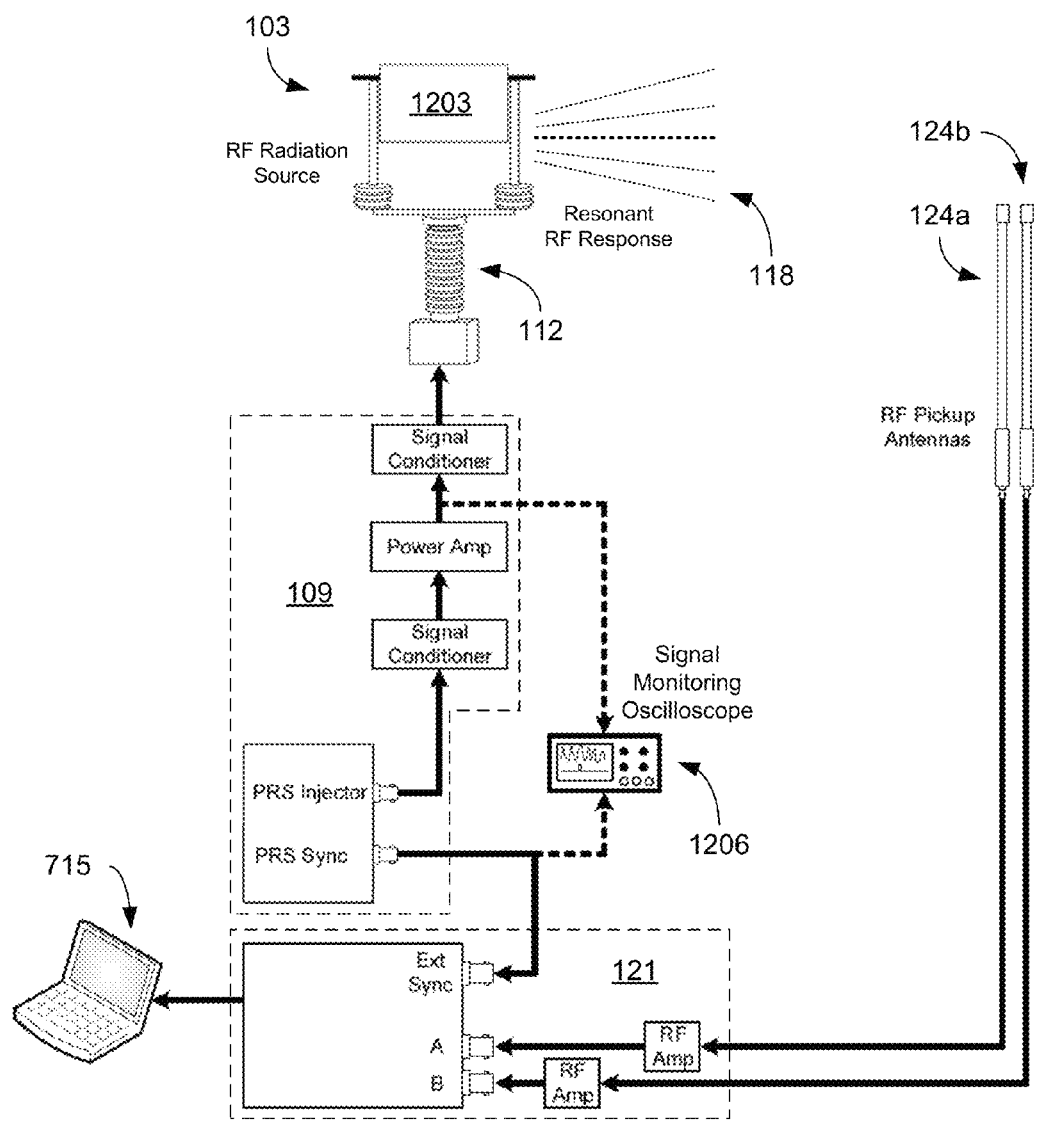

In another embodiment, the effect of the background RF signals may be eliminated or minimized by using synchronized capture of raw data from two RF antennas. Referring to FIG. 17, shown is an example of the wireless data capture system 121 configured to obtain synchronized data from a pair of RF antennas 124a and 124b. In the example of FIG. 17, the wireless data capture system 121 includes an impedance matching amplifier for each RF antenna 124a/124b. The PRS signal injection system 109 provides a PRS signal, which was conditioned by signal conditioners and a power amplifier, to the power system component 103 through, e.g., a power system interface. An external synchronizing signal can be provided by the PRS signal injection system 109 to the wireless data capture system 121 for synchronization of the PRS signal and the captured raw RF component data to facilitate analysis. An oscilloscope 1206 may be triggered using the external synchronizing signal to monitor, e.g., the effect of the signal conditioning and power amplification on the PRS signal. The injected PRS signal excites low level wireless RF transmissions 118 from the electrical component 103 that can be captured by the wireless data capture system 121 through the pair of RF antennas 124a and 1224b.

The raw RF component data from each RF antenna may be captured on separate channels (A and B) of, e.g., a Picoscope 4226 during injection of a PRS signal into the electrical component 103. By subtracting the raw RF component data obtained from the RF antenna 124b that is further away from the excited component 103 from the raw RF component data obtained from the RF antenna 124a that is closer to the power system component 103, at least a portion of the RF signals from other background sources may be removed. By simultaneously capturing the synchronized raw data, variations produced by time delays between samples may also be minimized.

Figure 18A:
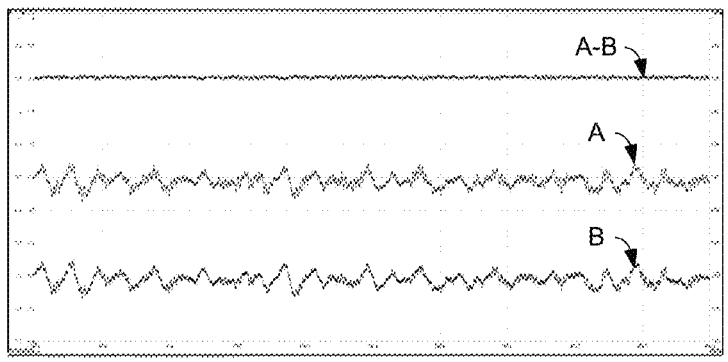
FIGS. 18A-18C are graphical plots of examples of raw data captured using the system of FIGS. 17 and 19 according to various embodiments of the present disclosure.
Figure 18B:
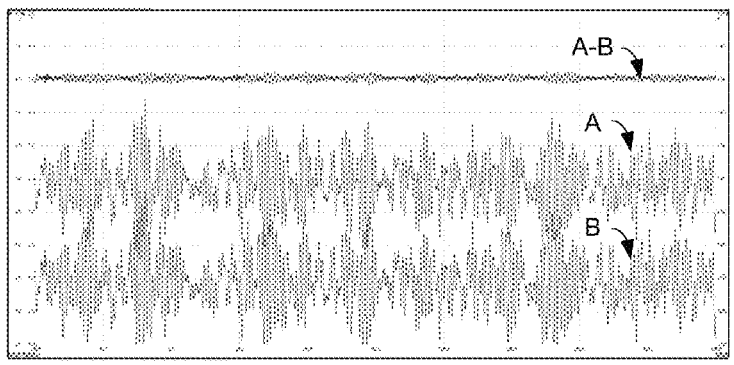
Figure 18C:
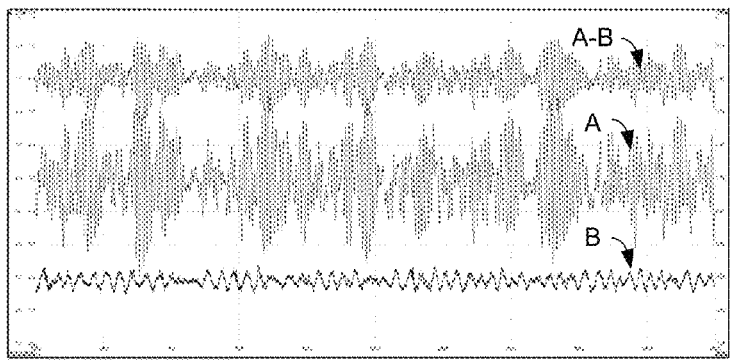

FIGS. 18A-18C illustrate the effect of antenna placement with respect to the electrical power system component 103. FIG. 18A shows examples of the raw data signals captured from RF antennas 124a and 124b on channels A and B when they were positioned together away from the excited component 103. As can be seen in FIG. 18A, the raw data signals captured on channels A and B are very similar. The difference between the captured raw data signals (A–B) is essentially zero since the antennas 124 are placed close together where the decrease in the RF signal from the electrical component 103 is small. As the pair of RF antennas 124a and 124b are moved closer to the power system component 103, the strength of the RF transmissions increases as illustrated by the raw data signals captured on channels A and B in FIG. 18B. However, since the antennas 124 remain close together, the difference between the captured raw data signals (A–B) is still small.

Figure 19:
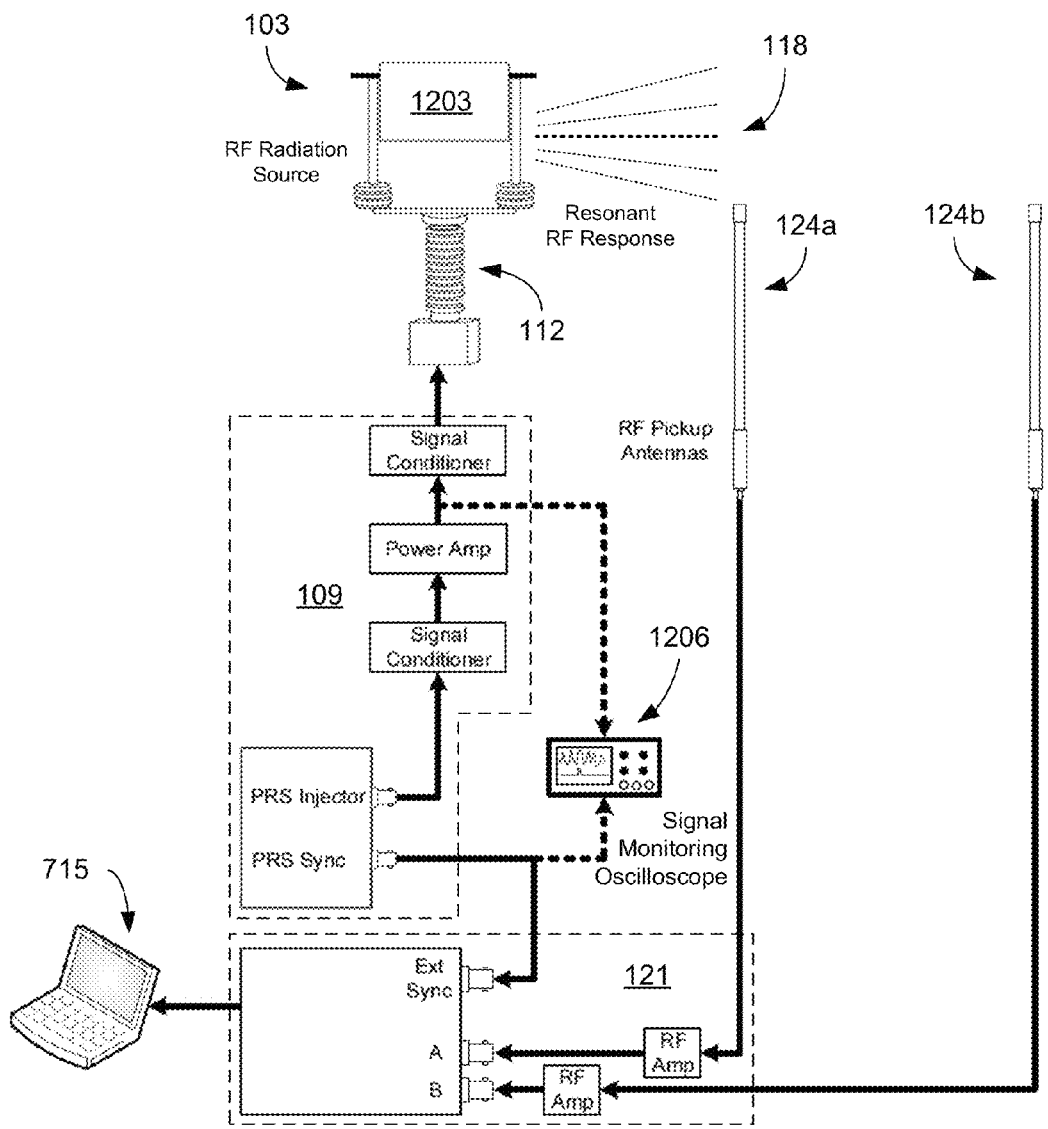

A more effective cancellation of background RF signals can be achieved by separating the two RF antennas 124a and 124b. FIG. 18C shows the effect of placing one RF antenna 124a near the power system component 103 and placing the other RF antenna 124b further away as depicted in FIG. 19. The difference in magnitude of the raw RF component data captured on channels A and B can be clearly seen in FIG. 18C. Since the RF signals from other RF sources are relatively constant, the difference between the captured raw data signals (A–B) substantially reduces the background noise leaving the raw RF component data corresponding to the RF transmissions produced by the injected PRS signal. The noise cancellation (A–B) may be carried out in either the time or frequency domain. By cross-correlating the difference signal (A–B), noise from other RF sources can be reduced in the frequency response.

Figure 20:
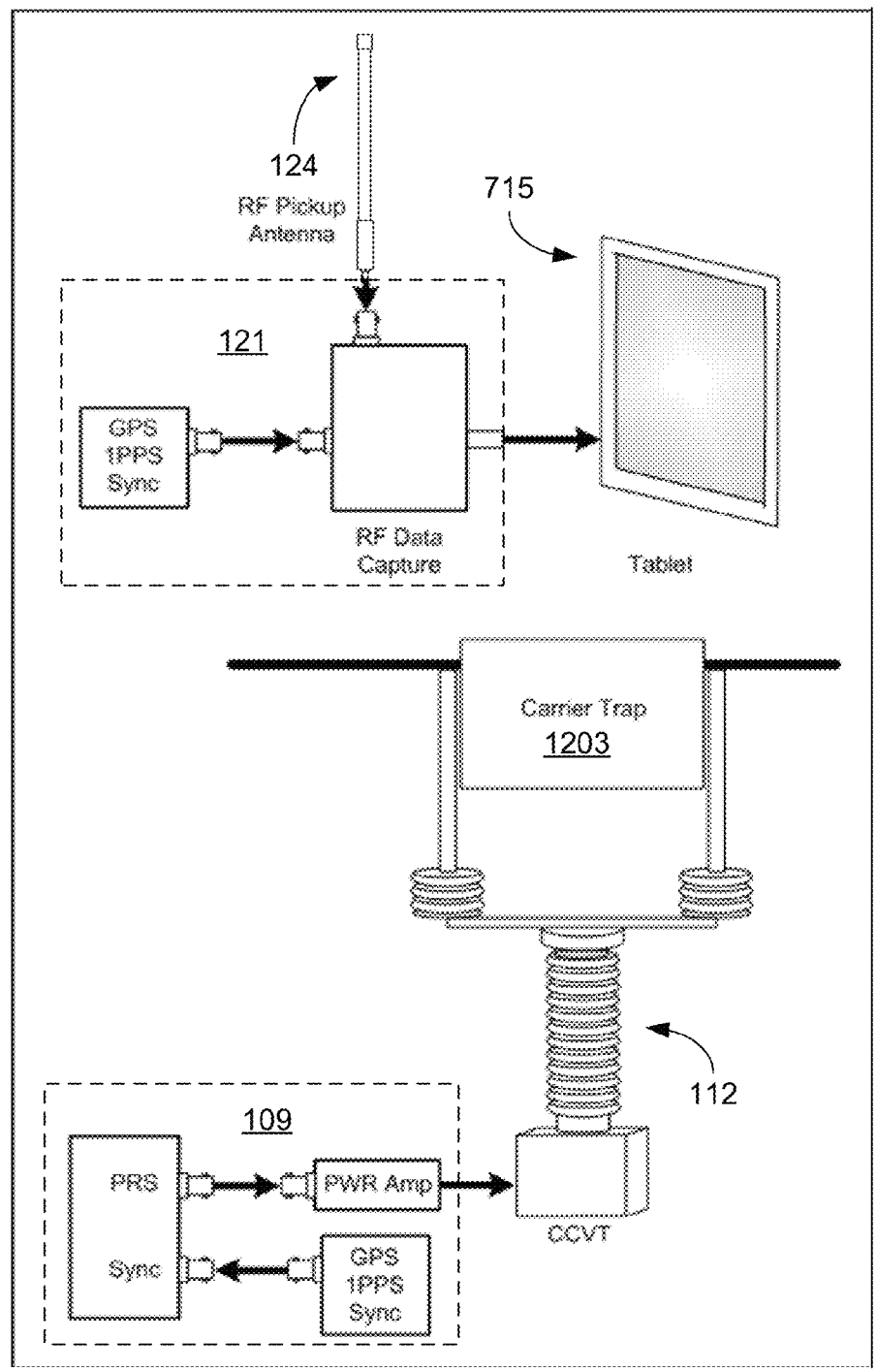

Referring next to FIG. 20, shown is another example of a system for synchronized PRS signal injection 109 into an electrical component 103 such as, e.g., a PLC trap 1203. In the embodiment of FIG. 20, periodic synchronization pulses are based upon timing from a GPS clock signal. This allows for synchronized operation of the PRS injection system 109 and the wireless data capture system 121 without being coupled together as illustrated in FIG. 12. A PRS signal, which may be conditioned by signal conditioners and/or a power amplifier, is provided to the PLC trap 1203 through a power system interface (CCVT) 112. The injected PRS signal excites low level wireless RF transmissions from the PLC trap 1203 that can be captured by the wireless data capture system 121 through the RF antenna 124. Data capture is synchronized to the beginning of the injected PRS by the GPS clock signal. The data capture system 121 may be configured to analyze the captured raw RF component data (e.g., by execution of a data analysis application) or a separate data analysis system 715 (e.g., another computing device such as, e.g., a laptop or tablet configured to execute a data analysis application) may obtain the captured raw RF component data for analysis. In some implementations, a single device may include the wireless data capture system 121, one or more RF antennas 124, the data analysis system 715, and display device. RF antennas 124 may be located at opposite ends of the device to allow for noise cancellation as described above. As can be understood, real-time monitoring and analysis may be applied to the captured raw RF component data 3. In some implementations, the raw RF component data may be stored in a data store and/or memory for subsequent off-line analysis as will be discussed. In some embodiments, the data may also be communicated to a central facility for storage and overall power system monitoring. This may be accomplished using, e.g., wireless communications, network connections, and/or communications over the power system 106 (FIG. 1).

The captured raw RF component data may be further processed for real-time monitoring. For example, a Fourier transform of the captured data can provide a frequency spectrum characteristic of the electrical power system component 103. As mentioned above, the frequency spectrum can also include characteristic frequencies of the power system interface 112 and other elements between the injection point and the wireless data capture system 121. The captured RF component data is cross-correlated with the injected PRS signal to provide the impulse response between the injection location and the RF antenna(s) 124. A Fourier transform of the impulse response can provide frequency response information about the power system component 103. A least squared sample difference between the current and a previous impulse response and/or frequency response may also be calculated. Some or all of the determined component information (e.g., the captured raw RF component data, the raw frequency response, the impulse response, the frequency response, and/or the least squared sample) may be used to determine a condition of the power system component 103.

Figure 21:
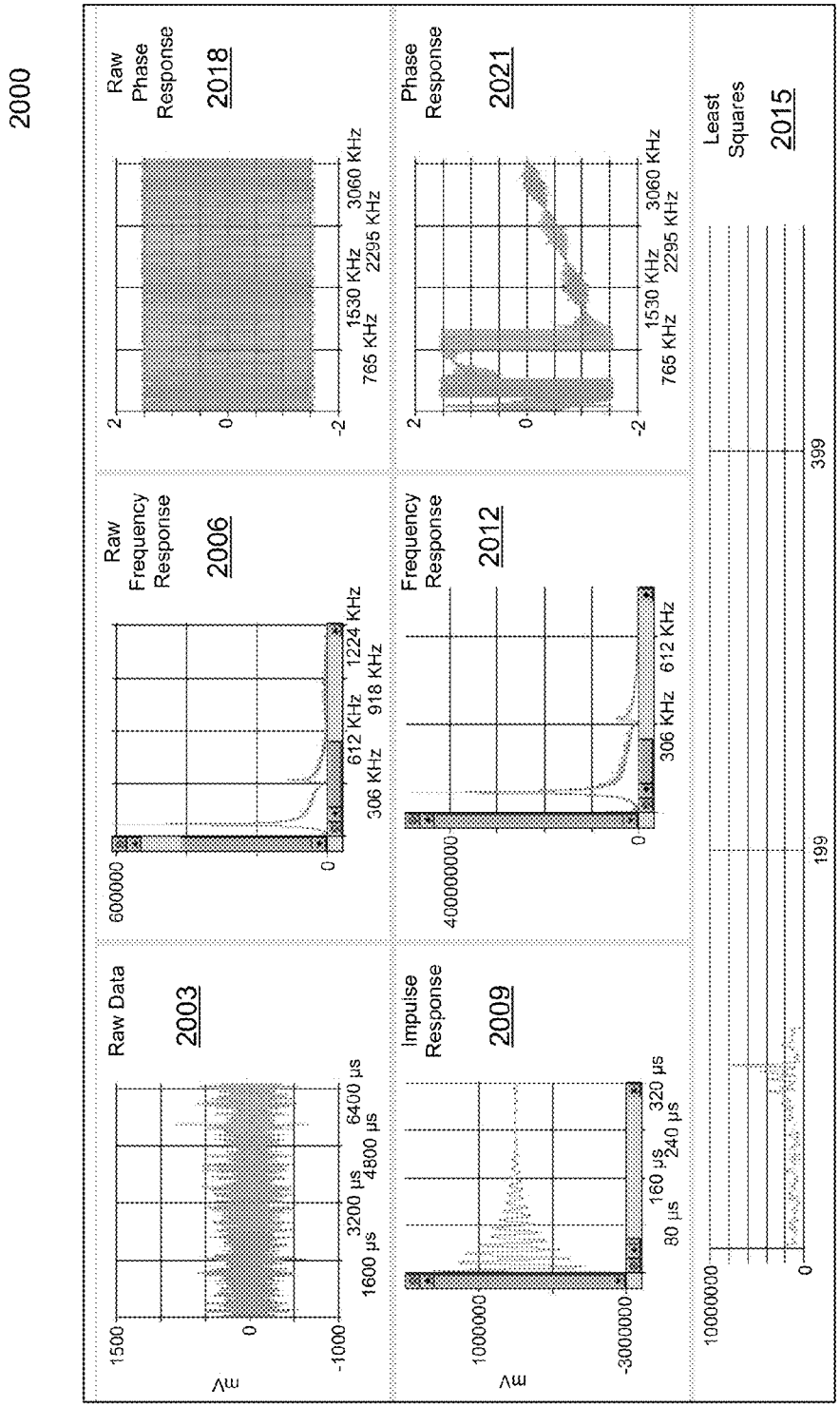
FIG. 21 is a graphical representation illustrating an example of window layout for displaying rendered real-time and off-line impulse and frequency response monitoring and analysis in accordance with various embodiments of the present disclosure

Graphical representations of the determined power system information may be generated and provided for rendering on a display device. FIG. 21 illustrates an example of a window layout 2000 for rendering on the display device. The window layout 2000 provides for monitoring and analysis of the current condition of the electrical component 103 and indications of changes in the component 103 based upon the determined component information. Window layout 2000 depicts an example of a rendered window including the power system information such as, e.g., captured raw RF component data 2003, the raw frequency response 2006 of the impulse response, the cross-correlated impulse response 2009, the frequency response 2012, and a least squared sample 2015. A rendered window may also include phase response information for the captured raw data 2018 and the impulse response 2021. The phase analysis waveforms can be used in the analysis of the component characteristics such as, e.g., determination of precise resonance frequencies of PLC traps.

Window layouts may also provide for side-by side analysis of the condition of the power system component 103 and indications of changes in the component 103 based upon the impulse response 2009, frequency response 2012, or other information associated with different injection/capture times. In some embodiments, operations such as zooming or changing displayed ranges may be coordinated between window frames including the same component information (e.g., impulse response 2009 or frequency response 2012) such that a modification to one frame is simultaneously carried out in all other frames including the same information. For example, impulse responses associated with different data acquisition times can be displayed with the same scaling. If the displayed range of one impulse response is adjusted, then the displayed range of the other impulse response simultaneously changes to the same scaling.

For off-line analysis, captured raw RF component data may be obtained from a data store and/or memory. The RF component data may then be processed for off-line analysis. A Fourier transform of the captured data can provide a frequency spectrum characteristic of the electrical power system component 103. The captured data may also be cross-correlated with the injected PRS signal to provide an impulse response of the electrical component 103. A Fourier transform of the impulse response can provide a frequency response of the component 103. In some implementations, a least squared sample difference between impulse responses and/or frequency responses of RF component data obtained at different times may also be calculated. Some or all of the determined power system information (e.g., the captured raw RF component data, the raw frequency response, the impulse response, frequency response, and phase angle response, and the least squared sample) may be used to determine a condition of the power system component 103. In some embodiments, power system information for a plurality of injection/capture times may be determined for comparison and analysis to determine conditions and/or changes in the power system component 103. Graphical representations of the determined power system information may be generated and provided for rendering on a display device as illustrated in FIG. 21.

Figure 22:
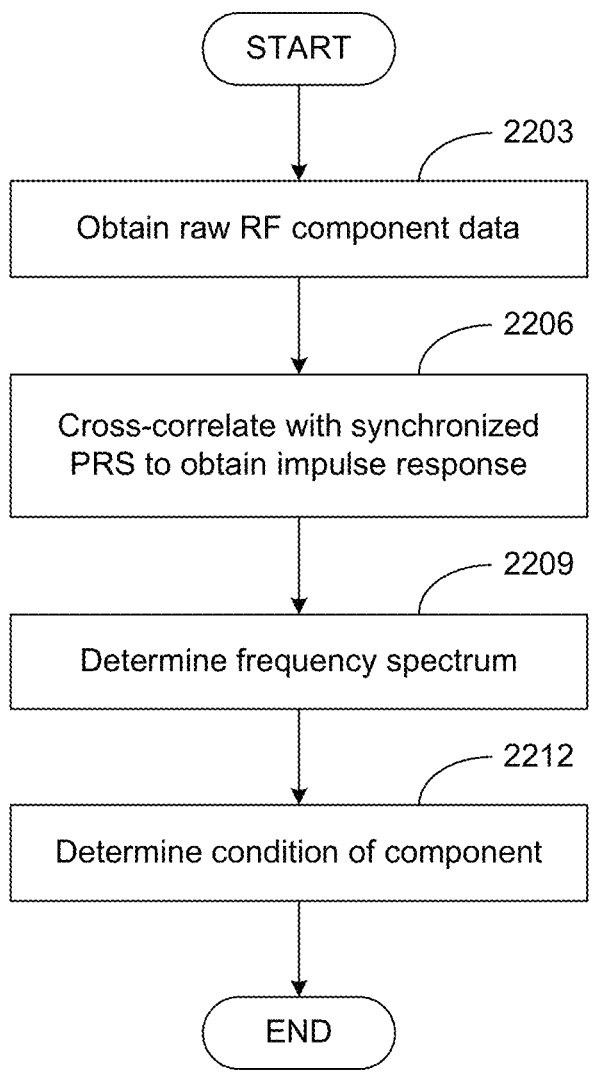
FIG. 22 is a flowchart illustrating examples of functionality implemented as portions of a data capture application and/or a data analysis application executed in one or more computing device(s) in the synchronized data capture and/or analysis of FIGS. 7, 9, 12, 17, 19, and 20 according to various embodiments of the present disclosure.

Referring next to FIG. 22, shown is a flowchart illustrating an example of functionality implemented as portions of the data capture and/or data analysis according to various embodiments of the present disclosure. It is understood that the flowchart of FIG. 22 provides merely an example of the many different types of functional arrangements that may be employed to implement the operation of the portion of the data capture and/or data analysis as described herein. As an alternative, the flowchart of FIG. 22 may be viewed as depicting examples of steps of a method implemented in the wireless data capture system 121 and/or data analysis device 715 (FIG. 7) according to one or more embodiments.

In the implementation of FIG. 22, raw RF component data is obtained from an electrical component 103 (FIG. 1) in block 2203. The raw RF component data may be obtained by the wireless data capture system 121 or may be obtained from a data store or memory. For example, a PRS signal may be injected into the electrical component 103 and the raw RF component data including the response to the PRS signal may be obtained as previously described. In block 2206, the raw RF component data is cross-correlated with a synchronized pseudo-random sequence (PRS), which was injected into the electrical component 103 during data capture. An impulse response is obtained by the cross-correlation of the raw RF component data with the PRS signal. In some implementations, noise reduction is carried out by averaging a plurality of raw RF component data sets corresponding to the PRS signal. In other implementations, synchronized raw RF component data from a pair of RF antennas is combined to reduce the background noise from other RF sources. A frequency spectrum is determined in block 2209 based upon the cross-correlated impulse response. The determination of the frequency spectrum may be in response to the cross-correlation meeting some predefined criteria or threshold condition. In some implementations, frequency spectrums are determined for captured data samples with and without an injected PRS signal. The frequency spectrums may be combined to remove background noise from other RF sources.

FIG. 23 illustrates frequency domain noise reduction with raw RF signals captured with and without PRS signal injection. Initially, a raw RF component signal 2303 including the response to the injected PRS signal ("a") and background noise ("b") (e.g., captured in period 2 of FIG. 16 or on channel A via RF antenna 124a of FIG. 19) and a raw RF signal 2306 including background noise ("b") without a PRS signal response (e.g., captured in period 4 of FIG. 16) or background noise with a reduced PRS signal response level (e.g., on channel b via RF antenna 124b of FIG. 19) are transformed from the time domain to the frequency domain by Fourier transformation 2309. The frequency domain signals ("A+B" and "B") are then subtracted 2312 to filter out the background noise ("B") components. An inverse Fourier transform 2315 converts the signal without background noise ("A") back to the time domain. The time domain response to the PRS signal ("a") without background noise is then cross-correlated 2318 with the injected PRS signal to obtain the impulse response (h(t)) of the electrical component 103. Fourier transformation 2321 of the impulse response provides the frequency response (H(f)) of the component 103.

FIG. 24 illustrates time domain noise reduction with raw RF signals captured with and without PRS signal injection. Initially, a raw RF component signal 2403 including the response to the injected PRS signal ("a") and background noise ("b") (e.g., captured on channel A via RF antenna 124a of FIG. 19) and a raw RF signal 2406 including background noise ("b") with a reduced PRS signal response level (e.g., on channel b via RF antenna 124b of FIG. 19) are subtracted 2412 to filter out the background noise ("b") component. By synchronizing the capture of both signals ("a+b" and "b"), the subtraction is greatly simplified. The time domain response to the PRS signal ("a") without background noise is then cross-correlated 2418 with the injected PRS signal to obtain the impulse response (h(t)) of the electrical component 103. Fourier transformation 2421 of the impulse response provides the frequency response (H(f)) of the component 103.

Referring back to FIG. 22, a condition of the electrical component 103 is determined in block 2212 based at least in part upon the one or more frequency spectrum(s), impulse response data, and/or other component characteristics. For example, the component may be a coupling capacitor voltage transformer (CCVT), transformer, transmission line, carrier trap, or other component included in a power transmission system as can be appreciated. The condition may correspond to a current operating condition (e.g., the resonant frequency of a carrier trap) or an existing fault condition. For example, the condition may be a change in a transformer winding such as, but not limited to, changes in tap position, arcing or shorted turns, and/or shifting of the winding or core. The condition of the electrical component 103 may be determined based upon changes in characteristic frequencies and/or the correlated impulse response associated with the component 103 using pattern recognition algorithms, neural networks, or other rule based identification methods as can be appreciated. The characteristic frequencies can include frequency components and/or frequency ranges of the frequency spectrum(s).

Figure 25:
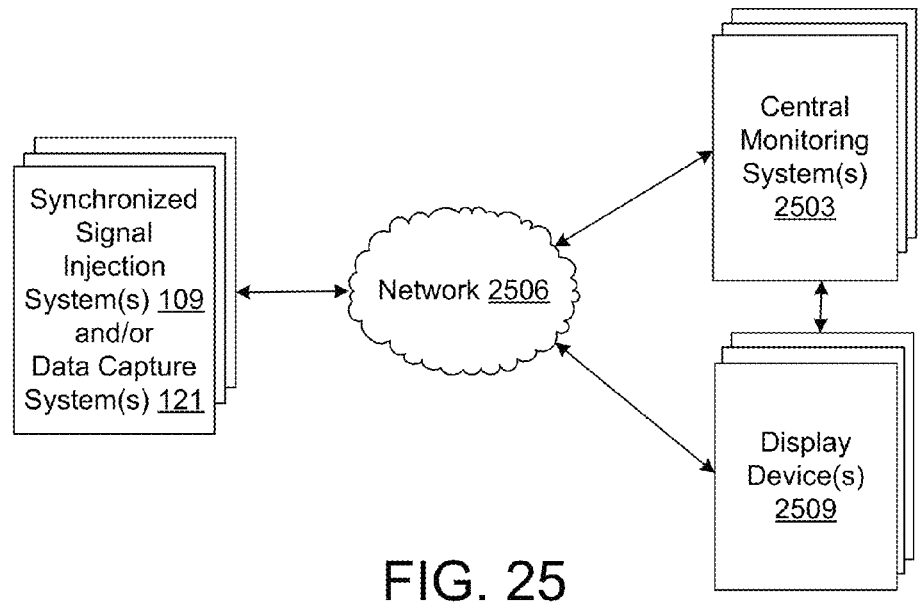
FIG. 25 is a graphical representation of a networked environment for synchronized PRS signal injection and/or raw RF component data capture for the electrical component of FIG. 1 according to various embodiments of the present disclosure.

Referring next to FIG. 25, shown is a networked environment for synchronized PRS signal injection system 109 and/or data capture system 121. The synchronized PRS signal injection system(s) 109 and/or data capture system(s) 121 may be located at electrical components throughout the power system 106 (FIG. 1). The synchronized PRS signal injection system 109 and/or data capture system 121 may be in communication with one or more central monitoring system(s) 2503 through a network 2506. The network 2506 includes, for example, the Internet, intranets, extranets, wide area networks (WANs), local area networks (LANs), wired networks, wireless networks, power line carrier networks, or other suitable networks, etc., or any combination of two or more such networks. The synchronized PRS signal injection system 109 and/or data capture system 121 may operate independently or their operation may be coordinated by the central monitoring system(s) 2503. For example, the central monitoring system(s) 2503 may coordinate PRS injection into the power system component 103 to facilitate capture of a single set of raw RF component data for analysis. In some implementations, the raw RF component data may be captured by a data capture device 712 and analyzed locally by a data analysis device 715 or remotely by the central monitoring system(s) 2503. The central monitoring system(s) 2503 may also obtain captured raw RF component data and/or impulse response frequency spectrums from multiple locations for a coordinated analysis of various components 103 in the power system 106. In addition, the central monitoring system(s) 2503 may allow selection of PRS parameters such as PN sequence length, PN sequence pattern, PRS magnitude, and/or bit clock period or frequency. Graphical representations and/or interactive interfaces may be provided directly and/or through the network 2506 for rendering by display device(s) 2509. Graphical representations may be displayed from captured raw power system data before storing or may be displayed from previously stored data. For example, impulse response data and/or frequency spectrum data for one or more correlated impulse response(s) may be displayed during real time data capture or during off-line operation. In some embodiments, an interactive interface may allow for configuration of the PRS signal injection system 109 and/or data capture system 121 such as, but not limited to, selection of PNS length, injection voltage, timebase, number of samples, oversampling, captured data file location, buffer size, etc.

The central monitoring system(s) 2503 may include, but are not limited to, Energy Management Systems (EMS), Supervisory Control and Data Acquisition (SCADA) systems, or other monitoring systems as can be appreciated. Analysis of the impulse response frequency spectrums may be used to provide a real-time indication of the state of the power system components 103 in the power system 106 (FIG. 1) through the central monitoring system(s) 2503 as described in U.S. Pat. No. 7,848,897, entitled "Dynamic Real-Time Power System Monitoring" and issued on Dec. 7, 2010, the entirety of which is hereby incorporated by reference. The central monitoring system(s) 2503 may generate one or more graphical representation(s) and/or window(s) for rendering on display device(s) 2509.

The graphical window can provide control center users (i.e., operators, engineers, planners and coordinators) with a visual depiction of the condition of the power system components 103. For example, a graphical representation of the power system 106 may include a color coded display corresponding to the condition of the components 103 in the power system 106. These visual depictions may be geographically based, including the spatial orientation of the actual source locations collecting the impulse data from substations, generating plants and tie lines throughout the grid of the power system 106.

Overall impulse response parameters associated with the power system 106 such as, but not limited to, connectiveness and responsiveness may also be determined based upon the determined condition of the power system components 103. In some embodiments, graphical representations of the impulse response, frequency spectrum, and/or least squares differences, as illustrated in FIG. 21, may be generated for rendering on a display device 2509. The central monitoring system(s) 2503 may also use the condition of the power system component 103 to automatically adjust the operation of the component 103 and/or the power system 106.

Figure 26:
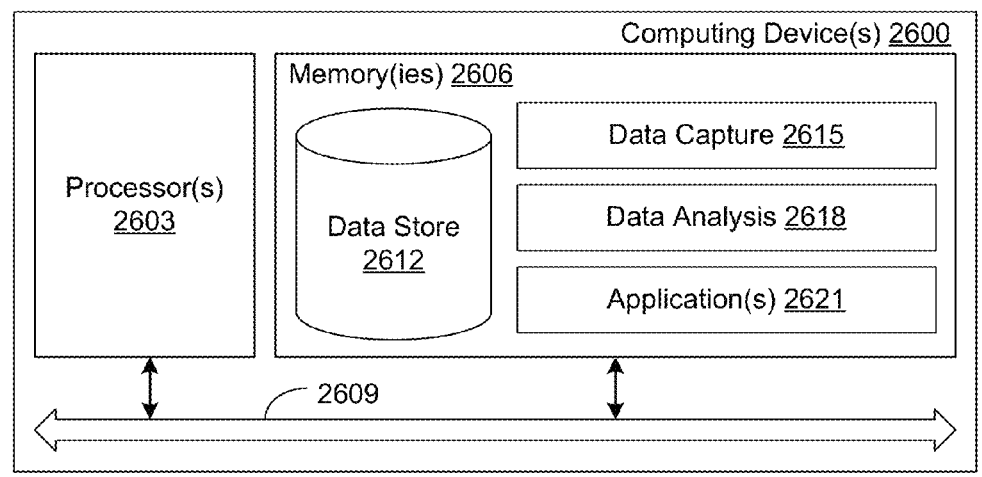
FIG. 26 is a schematic block diagram that provides one example illustration of a computing device employed in the synchronized data capture and/or analysis of FIG. 8 according to various embodiments of the present disclosure.

With reference to FIG. 26, shown is a schematic block diagram of a computing device 2600 according to various embodiments of the present disclosure. The computing device 2600 includes at least one processor circuit, for example, having a processor 2603 and a memory 2606, both of which are coupled to a local interface 2609. To this end, the computing device 2600 may comprise, for example, at least one server computer or like device. The local interface 2609 may comprise, for example, a data bus with an accompanying address/control bus or other bus structure as can be appreciated.

Stored in the memory 2606 are both data and several components that are executable by the processor 2603. In particular, stored in the memory 2606 and executable by the processor 2603 are a data capture application 2615, a data analysis application 2618, and/or other applications 2621. Also stored in the memory 2606 may be a data store 2612 and other data. In addition, an operating system may be stored in the memory 2606 and executable by the processor 2603.

It is understood that there may be other applications that are stored in the memory 2606 and are executable by the processor 2603 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Delphi®, Flash®, or other programming languages.

A number of software components are stored in the memory 2606 and are executable by the processor 2603. In this respect, the term "executable" means a program file that is in a form that can ultimately be run by the processor 2603. Examples of executable programs may be, for example, a compiled program that can be translated into machine code in a format that can be loaded into a random access portion of the memory 2606 and run by the processor 2603, source code that may be expressed in proper format such as object code that is capable of being loaded into a random access portion of the memory 2606 and executed by the processor 2603, or source code that may be interpreted by another executable program to generate instructions in a random access portion of the memory 2606 to be executed by the processor 2603, etc. An executable program may be stored in any portion or component of the memory 2606 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 2606 is defined herein as including both volatile and nonvolatile memory and data storage components. Volatile components are those that do not retain data values upon loss of power. Nonvolatile components are those that retain data upon a loss of power. Thus, the memory 2606 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 2603 may represent multiple processors 2603 and the memory 2606 may represent multiple memories 2606 that operate in parallel processing circuits, respectively. In such a case, the local interface 2609 may be an appropriate network 2506 (FIG. 25) that facilitates communication between any two of the multiple processors 2603, between any processor 2603 and any of the memories 2606, or between any two of the memories 2606, etc. The local interface 2609 may comprise additional systems designed to coordinate this communication, including, for example, performing load balancing. The processor 2603 may be of electrical or of some other available construction.

Although the data capture application 2615, the data analysis application 2618, application(s) 2621, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowchart of FIG. 22 shows the functionality and operation of an implementation of portions of the data capture application 2615 and/or the data analysis application 2618. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 2603 in a computer system or other system. The machine code may be converted from the source code, etc. If embodied in hardware, each block may represent a circuit or a number of interconnected circuits to implement the specified logical function(s).

Although the flowchart of FIG. 22 shows a specific order of execution, it is understood that the order of execution may differ from that which is depicted. For example, the order of execution of two or more blocks may be scrambled relative to the order shown. Also, two or more blocks shown in succession in FIG. 22 may be executed concurrently or with partial concurrence. Further, in some embodiments, one or more of the blocks shown in FIG. 22 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the data capture application 2615, the data analysis application 2618, and/or application(s) 2621, that comprises software or code can be embodied in any non-transitory computer-readable medium for use by or in connection with an instruction execution system such as, for example, a processor 2603 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method, comprising:
   obtaining, in at least one computing device, raw radio frequency (RF) component data radiated from an electrical component, where the raw RF component data is captured through an RF antenna that is not physically connected to the electrical component;
   cross-correlating, in at least one computing device, the raw RF component data with a synchronized pseudo-random sequence (PRS) signal injected into the electrical component to determine a correlated impulse response; and
   determining, in at least one computing device, a condition of the electrical component based at least in part upon the correlated impulse response.

2. The method of claim 1, wherein the RF antenna is an external RF antenna collocated with the electrical component.

3. The method of claim 2, wherein the raw RF component data is synchronized pseudo-random sequence signal injected into the electrical component while the electrical component is energized.

4. The method of claim 1, further comprising:
   determining a frequency spectrum in response to the cross-correlation, the frequency spectrum based upon the correlated impulse response; and determining a condition of the electrical component based at least in part upon the correlated impulse response.

5. The method of claim 1, wherein determining the condition of the electrical component comprises determining characteristic frequencies of the component.

6. The method of claim 1, wherein the electrical component is a component in a power system.

7. The method of claim 6, wherein the component included in the power system is a power line coupling (PLC) trap.

8. The method of claim 7, wherein the condition is a resonant frequency of the PLC trap.

9. The method of claim 1, wherein the condition of the electrical component is based at least in part upon changes in the frequency spectrum at characteristic frequencies associated with the electrical component.

10. The method of claim 9, wherein the characteristic frequencies are a range of frequencies of the frequency spectrum.

11. The method of claim 1, further comprising:
obtaining a plurality of sets of raw RF component data radiated from the electrical component; and
reducing background noise from other RF sources based upon averaging a combination of the plurality of sets of raw RF component data, where the averaging produces averaged raw RF component data.

12. The method of claim 11, wherein cross-correlating the raw RF component data comprises cross-correlating the averaged raw RF component data with the synchronized pseudo-random sequence signal.

13. A system, comprising:
a signal injection system coupled to an electrical component, the signal injection system configured to inject a synchronized pseudo-random sequence (PRS) signal into the electrical component;
a data capture device configured to obtain raw RF component data radiated from the electrical component through a radio frequency (RF) antenna that is not physically connected to the electrical component, the raw RF component data synchronized with the PRS signal; and
a data analysis device configured to cross-correlate the raw RF component data with the PRS signal to determine characteristics associated with the electrical component.

14. The system of claim 13, wherein the data analysis device is further configured to:
determine a frequency response from the cross-correlated raw RF component data; and
determine a condition of the electrical component based at least in part upon the frequency response.

15. The system of claim 13, wherein the data capture device is configured to concurrently obtain raw RF component data from each of a pair of collocated RF antennas, each of the pair of collocated RF antennas at a different distance from the electrical component.

16. The system of claim 15, wherein the data analysis device is further configured to cross-correlate the difference between the raw RF component data concurrently obtained from each of the pair of radio RF antennas to determine characteristics associated with the electrical component.

17. The system of claim 13, wherein the data capture device is further configured to obtain a series of raw RF component data sets through the RF antenna, wherein the series of raw RF component data sets are averaged to reduce background noise in the raw RF component data from other RF sources.

18. The system of claim 13, wherein the signal injection system is coupled to the electrical component through a power system interface.

19. The system of claim 13, wherein the data capture device and the data analysis device are the same device.

20. A non-transitory computer-readable medium embodying a program executable in a computing device, the program comprising:
code that obtains raw RF component data radiated from a power system component, where the raw RF component data is captured through an RF antenna that is not physically connected to the electrical component and averaged to reduce background noise from other RF sources;
code that cross-correlates the raw RF component data with a synchronized pseudo-random sequence signal injected into the power system component to determine a correlated impulse response; and
code that determines a condition of the power system component based at least in part upon the correlated impulse response.

* * * * *